(12) United States Patent
Lin et al.

(10) Patent No.: US 12,362,014 B2
(45) Date of Patent: Jul. 15, 2025

(54) IN-MEMORY COMPUTING (IMC) MEMORY DEVICE AND IN-MEMORY COMPUTING METHOD

(71) Applicant: MACRONIX INTERNATIONAL CO., LTD., Hsinchu (TW)

(72) Inventors: Yu-Yu Lin, New Taipei (TW); Feng-Min Lee, Hsinchu (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 181 days.

(21) Appl. No.: 18/303,726

(22) Filed: Apr. 20, 2023

(65) Prior Publication Data

US 2024/0355387 A1  Oct. 24, 2024

(51) Int. Cl.
*G11C 13/00* (2006.01)

(52) U.S. Cl.
CPC ........ *G11C 13/004* (2013.01); *G11C 13/0026* (2013.01); *G11C 13/0061* (2013.01)

(58) Field of Classification Search
CPC .............. G11C 13/004; G11C 13/0026; G11C 13/0061
USPC ........................................................ 365/148
See application file for complete search history.

(56) References Cited

U.S. PATENT DOCUMENTS

2021/0072956 A1\* 3/2021 Seo .......................... G11C 16/32
2021/0158854 A1\* 5/2021 Sinangil ................ G11C 11/412

OTHER PUBLICATIONS

Jung, et al.: "A crossbar array of magnetoresistive memory devices for in-memory computing"; https://doi.org/10.1038/s41586-021-04196-6; Published online: Jan. 12, 2022; pp. 211-227.
Lin, et al.: "A Novel Voltage-Accumulation Vector-Matrix Multiplication Architecture Using Resistor-shunted Floating Gate Flash Memory Device for Low-power and High-density Neural Network Applications"; 978-1-7281-1987-8/18/ $31.00 © 2018 IEEE; pp. 2.4.1-2.4.4.

\* cited by examiner

*Primary Examiner* — Amir Zarabian
*Assistant Examiner* — Daniel J King
(74) *Attorney, Agent, or Firm* — McClure, Qualey & Rodack, LLP

(57) ABSTRACT

An in-memory computing memory device includes: a plurality of computing memory cells forming a plurality of memory strings, the computing memory cells storing a plurality of weight values; a loading capacitor; and a measurement circuit. In IMC operations, a plurality of input voltages, corresponding to a plurality of input values, are input into the computing memory cells; a plurality of effective resistances of the computing memory cells are corresponding to the input voltages and the weight values; when a read voltage is applied to the plurality of computing memory cells, the computing memory cells generate a plurality of cell currents which are summed into a plurality of memory string currents for charging the loading capacitor; and based a capacitor voltage of the loading capacitor, at least one delay time and a predetermined voltage, an operation result of the input values and the weight values is determined.

19 Claims, 15 Drawing Sheets

1

IN-MEMORY COMPUTING (IMC) MEMORY DEVICE AND IN-MEMORY COMPUTING METHOD

TECHNICAL FIELD

The present disclosure relates to an in-memory computing (IMC) memory device and IMC method.

BACKGROUND

For the neural network calculation and applications, the vector-matrix multiplication (i.e. perceptron operation) is widely used. While implementing the neural network calculation in a computing-in-memory architecture, the weight values are stored in the memory array and the inputs are applied to the memory array for performing the perceptron calculation to reduce the power consumption and improve the efficiency.

Due to the memory array structure, the inputs for the perceptron operation or the vector-matrix multiplication are usually applied from the word line side and the bit line side, and the calculation results are read out by a sensing amplifier (SA). Thus, the number of the inputs is limited by the memory array size and the accumulated total current amplitude at the SA.

Since the number of the inputs is limited by the memory array size, there is an implementation to separate the inputs in to many input groups. The reading results from many input groups are sensed by several different SAs and then summed. The summation of the many reading results from different SAs might induce the reading error, and cost more time or/and energy consumption.

For the computing-in-memory architecture, there are two popular way to estimate the IMC result, i.e. the sum-of-current and sum-of-voltage approaches.

For the sum-of-current architecture, the summation current might be too large for a too large input number, and there needs to reduce the cell currents or a special design for the SA to handle the large current. However, the design is more complex.

For the sum-of-voltage architecture, the resistance of each computing memory cell should be low to have large sensing current and reduce the body effect.

Thus, there needs an IMC memory device and an IMC method for improving the prior art disadvantages.

SUMMARY

According to one aspect of the disclosure, an IMC memory device is provided. The in-memory computing (IMC) memory device includes: a plurality of computing memory cells, the plurality of computing memory cells forming a plurality of memory strings, the plurality of computing memory cells storing a plurality of weight values; a loading capacitor coupled to the plurality of computing memory cells; and a measurement circuit coupled to the loading capacitor. In IMC operations, a plurality of input voltages are input into the plurality of computing memory cells, the plurality of input voltages being corresponding to a plurality of input values; a plurality of effective resistances of the computing memory cells are corresponding to the input voltages and the weight values; when a read voltage is applied to the plurality of computing memory cells, the plurality of computing memory cells generate a plurality of cell currents, the plurality of cell currents are summed into a plurality of memory string currents; the plurality of memory string currents from the plurality of memory strings charge the loading capacitor; the measurement circuit measures a capacitor voltage of the loading capacitor; and based a relationship between the capacitor voltage of the loading capacitor, at least one delay time and a predetermined voltage, an operation result of the plurality of input values and the plurality of weight values is determined.

According to another aspect of the disclosure, an IMC method applicable to an IMC memory device is provided. The in-memory computing (IMC) method includes: storing a plurality of weight values in a plurality of computing memory cells, the plurality of computing memory cells forming a plurality of memory strings; inputting a plurality of input voltages into the plurality of computing memory cells, the plurality of input voltages being corresponding to a plurality of input values, a plurality of effective resistances of the computing memory cells are corresponding to the input voltages and the weight values; when a read voltage is applied to the plurality of computing memory cells, generating a plurality of cell currents by the plurality of computing memory cells, the plurality of cell currents are summed into a plurality of memory string currents; charge the loading capacitor by the plurality of memory string currents from the plurality of memory strings; measuring a capacitor voltage of the loading capacitor; and based a relationship between the capacitor voltage of the loading capacitor, at least one delay time and a predetermined voltage, determining an operation result of the plurality of input values and the plurality of weight values.

Figure 1:
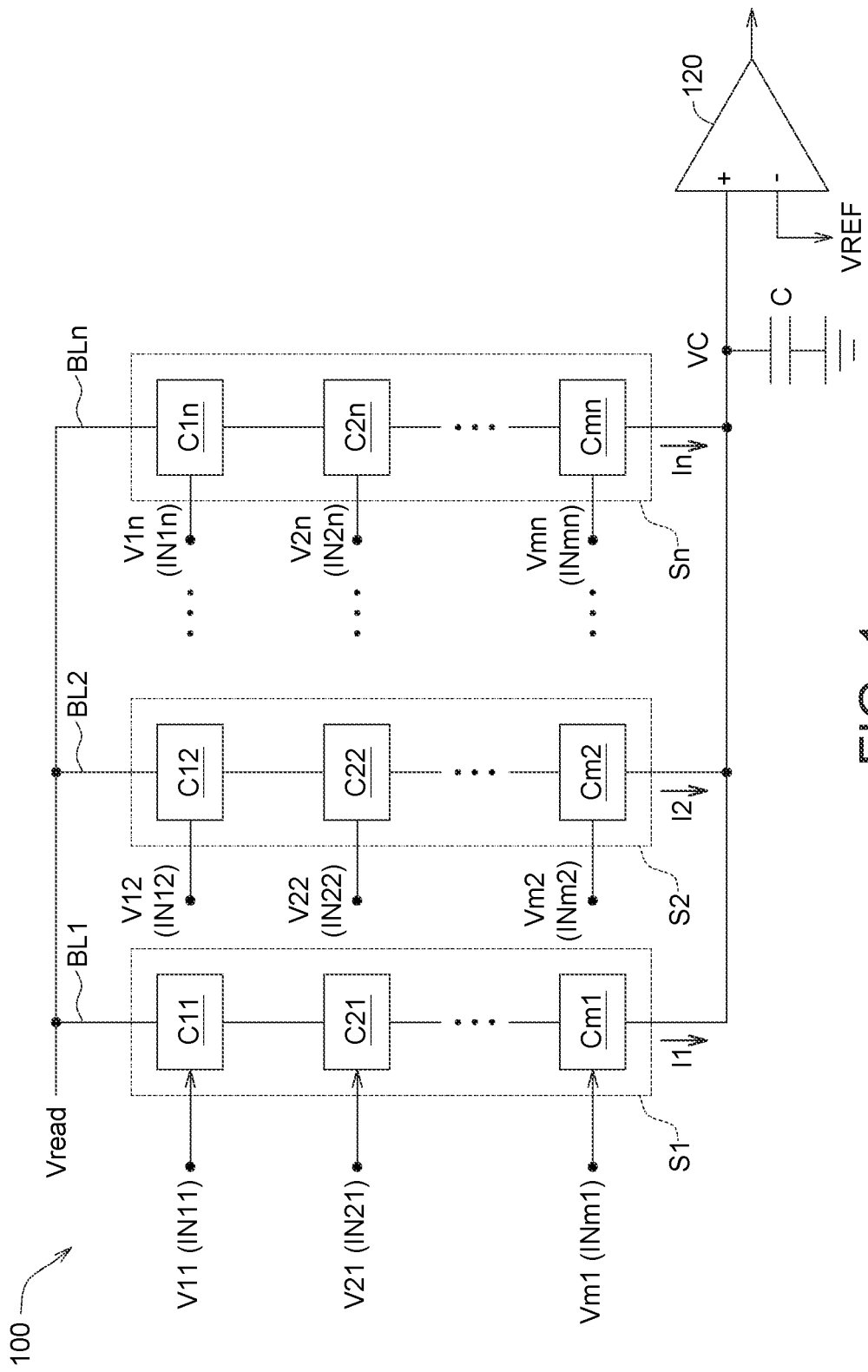
FIG. 1 is a schematic diagram of an IMC memory device of one embodiment of the application.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically illustrated in order to simplify the drawing.

DETAILED DESCRIPTION

FIG. 1 is a schematic diagram of an IMC memory device 100 according to one embodiment of the application. As shown in FIG. 1, the IMC memory device 100 according to one embodiment of the application includes a plurality of computing memory cells C11-Cmn, a loading capacitor C and a measurement circuit 120. The computing memory cells C11-Cmn are coupled to the loading capacitor C and the measurement circuit 120. In one possible example, the measurement circuit 120 may be implemented by a sensing amplifier (SA). The measurement circuit 120 compares a capacitor voltage VC of the loading capacitor C with a reference voltage VREF.

The computing memory cells C11-Cmn are disposed and arranged in n's vertical columns and m's horizontal rows to perform in-memory computing (IMC). The computing memory cells in the same vertical column form a memory string. Thus, there are n memory strings S1~Sn. The memory strings S1 includes the computing memory cells C11, C21, . . . . Cm1; and others are so on.

The computing memory cells C11~Cmn receive the input voltages V11~Vmn, respectively. In details, the computing memory cells C11, C21 . . . , Cm1 receive the input voltages V11, V21, . . . , Vm1; the computing memory cells C12, C22, . . . , Cm2 receive the input voltages V12, V22, . . . , Vm2, respectively. The input voltages V11~Vmn are corresponding to a plurality of input values IN11~INmn.

The computing memory cells C11-Cmn store a plurality of weight values W11Wmn.

The memory strings are parallel coupled. The memory string currents I1~In charge the loading capacitor C.

In one embodiment of the application, when a read voltage Vread is applied to terminals of the computing memory cells C11-Cmn of the IMC memory device 100, the computing memory cells C11-Cmn may generate a plurality of cell currents. The cell currents generated by the computing memory cells of the same memory string are summed into the memory string current.

In one embodiment of the application, in IMC operations, the read voltage Vread is applied to terminals (for example but not limited by, drains) of the computing memory cells C11-Cmn of the IMC memory device 100, and the capacitor voltage VC of the loading capacitor C is measured to identify a charge time (or said, a delay time) during which the loading capacitor C is charged to a predetermined voltage. For simplicity, a timing when the read voltage Vread is applied is called a first timing; and a timing when the loading capacitor C is charged to the predetermined voltage is called a second timing. In one embodiment of the application, the delay time is defined as: from the first timing to the second timing. The capacitor voltage VC of the loading capacitor C is measured by the measurement circuit 120 to identify the delay time of the loading capacitor C.

In one embodiment of the application, the memory string resistance Ri (i=1~n) of the memory string Si (i=1~n) is expressed as:

$$R_i = \sum\nolimits_{k=1\sim m} R_{ki}(IN_{ki}).$$

"i" refers the memory string index, "k" refers to the index of the computing memory cell in the memory string and there are m computing memory cells in one memory string.

Thus, the memory string current Ii of the memory string Si is expressed as:

$$I_i = V_{read} \Big/ \sum\nolimits_{k=1\sim m} R_{ki}(IN_{ki}).$$

The weight values W11~Wmn of the computing memory cell are functions of the input values IN11~INmn and thus are expressed as the resistance function Wki=$R_{ki}$(IN$_{ki}$).

In one embodiment of the application, the charge time (or said, the delay time) during which the loading capacitor C is charged to the predetermined voltage is used to represent a sum of product of the weight values W11~Wmn of the computing memory cells C11~Cmn with the input values IN11~INmn. That is because, in one embodiment of the application, a sum of product of the weight values W11~Wmn of the computing memory cells C11~Cmn with the input values IN11~INmn is a total current Itotal. The total current Itotal may be represented as:

$$I_{Total} = \sum\nolimits_{i=1\sim n} I_i = \sum\nolimits_{i=1\sim n} V_{read} \Big/ \sum\nolimits_{k=1\sim m} R_{ki}(IN_{ki}).$$

The total current Itotal charges the loading capacitor C and thus the timing when the capacitor voltage VC of the loading capacitor C is charged to the predetermined voltage is corresponding to the capacitance of the loading capacitor C and the total current Itotal. In one embodiment of the application, the capacitance of the loading capacitor C is given. Thus, in one embodiment of the application, the timing when the capacitor voltage VC of the loading capacitor C is charged to the predetermined voltage is in negative correlation with the total current Itotal. That is, when the total current Itotal is higher, the period during the capacitor voltage VC of the loading capacitor C is charged to the predetermined voltage is shorter; and when the total current Itotal is lower, the period during the capacitor voltage VC of the loading capacitor C is charged to the predetermined voltage is longer.

Thus, in one embodiment of the application, in given cases, the relationship between (1) the delay time at which the capacitor voltage VC of the loading capacitor C is charged to the predetermined voltage; and (2) the sum of product of the weight values W11~Wmn of the computing memory cells C11~Cmn with the input values IN11~INmn may be identified in advance. In the following IMC operations, the measured delay time is converted into the sum of product of the weight values W11~Wmn of the computing memory cells C11~Cmn with the input values IN11~INmn.

In one embodiment of the application, when the weight value of the computing memory cell and/or the input value is changed, the effective resistance of the computing memory cell is also changed. This results in different delay time (charge time).

Figure 2A:
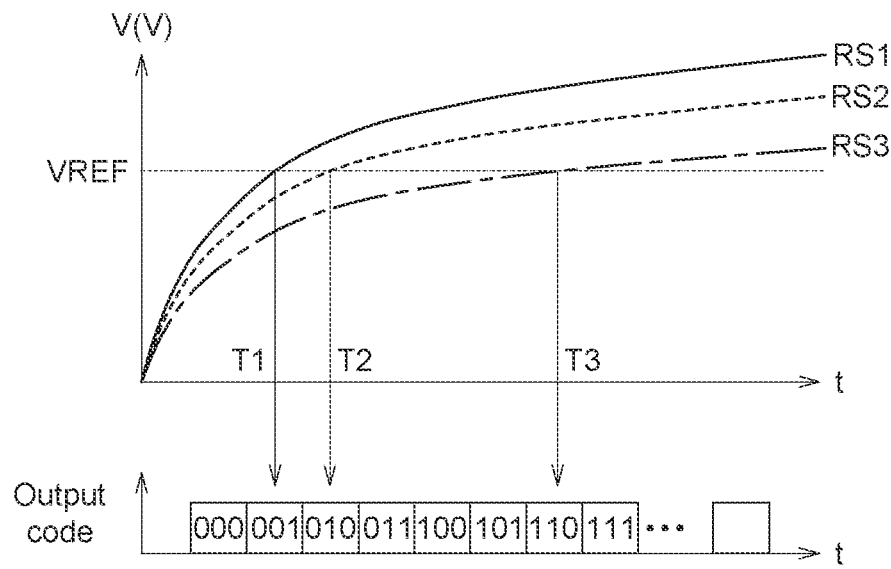
FIG. 2A and FIG. 2B shows measurements of delay time according to one embodiment of the application.
Figure 2B:
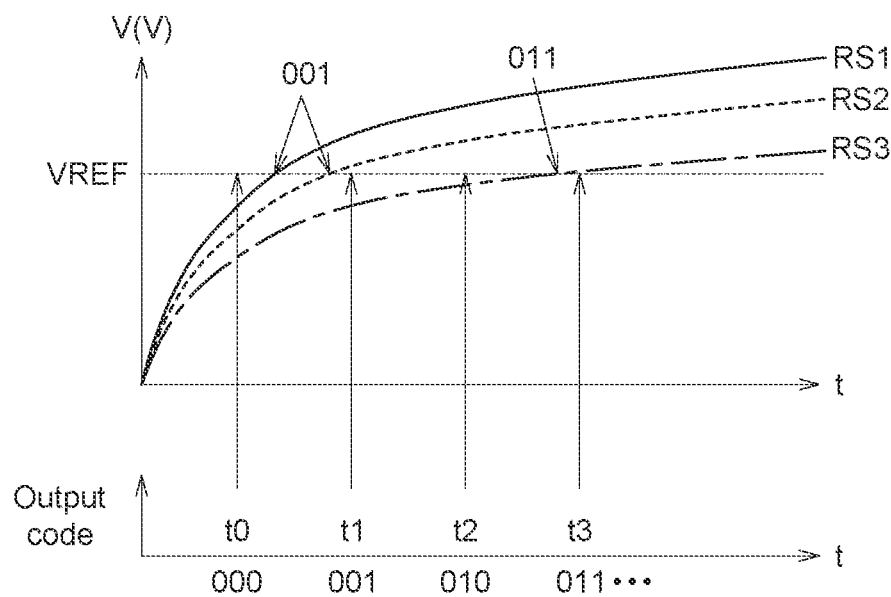

FIG. 2A and FIG. 2B shows measurements of delay time according to one embodiment of the application. In FIG. 2A and FIG. 2B, RS1, RS2 and RS3 refer to different total effective resistance values of the S1~Sn, wherein RS1<RS2<RS3.

In FIG. 2A, the delay time is defined as from a first timing when the read voltage is applied until a second timing when the capacitor voltage of the loading capacitor is charged to a predetermined voltage, the predetermined voltage is determined based on the read voltage.

In FIG. 2A, when the total effective resistance values of the S1~Sn is RS1, at the timing T1, the loading capacitor C is charged to the predetermined voltage VREF. Thus, the delay time T1 indicates that the sum-of-product of the weight values W11~Wmn and the input values IN11~INmn is "001" (output code). Similarly, when the total effective resistance values of the S1~Sn is RS2, at the timing T2, the loading capacitor C is charged to the predetermined voltage VREF. Thus, the delay time T2 indicates that the sum-of-product of the weight values W11~Wmn and the input values IN11~INmn is "010" (output code). When the total effective resistance values of the S1~Sn is RS3, at the timing T3, the loading capacitor C is charged to the predetermined voltage VREF. Thus, the delay time T3 indicates that the sum-of-product of the weight values W11~Wmn and the input values IN11~INmn is "011" (output code). Others are so on.

Further, in another embodiment of the application, a plurality of predetermined delay times are selected. At the plurality of predetermined delay times, the capacitor voltage VC and the reference voltage VREF are compared and the comparison result indicates an operation result (for example, sum-of-product) of the input values and the weights values, as shown in FIG. 2B. That is, a plurality of predetermined delay times (t0~t3) are selected. At the plurality of predetermined delay times, whether the capacitor voltage VC reaches the predetermined voltage VREF is checked, for determining the operation result (for example, sum-of-product) of the input values and the weights values. For example, at the delay time to, if the capacitor voltage VC reaches the predetermined voltage VREF, the operation result (for example, sum-of-product) of the input values and the weights values is determined as being 000; at the delay time t1, if the capacitor voltage VC reaches the predetermined voltage VREF, the operation result (for example, sum-of-product) of the input values and the weights values is determined as being 001; and others are so on.

In FIG. 2B, when the total effective resistance values of the S1~Sn is RS1, at the timing t1, the capacitor voltage VC reaches the predetermined voltage VREF, and the operation result (for example, sum-of-product) of the input values and the weights values is determined as 001 (output code). Similarly, when the total effective resistance values of the S1~Sn is RS2, at the timing t1, the capacitor voltage VC reaches the predetermined voltage VREF, and the operation result (for example, sum-of-product) of the input values and the weights values is determined as being 001 (output code). When the total effective resistance values of the S1~Sn is RS3, at the timing t3, the capacitor voltage VC reaches the predetermined voltage VREF, and the operation result (for example, sum-of-product) of the input values and the weights values is determined as being 011 (output code).

Now, the computing memory cells according to different embodiments of the application are described.

Figure 3A:
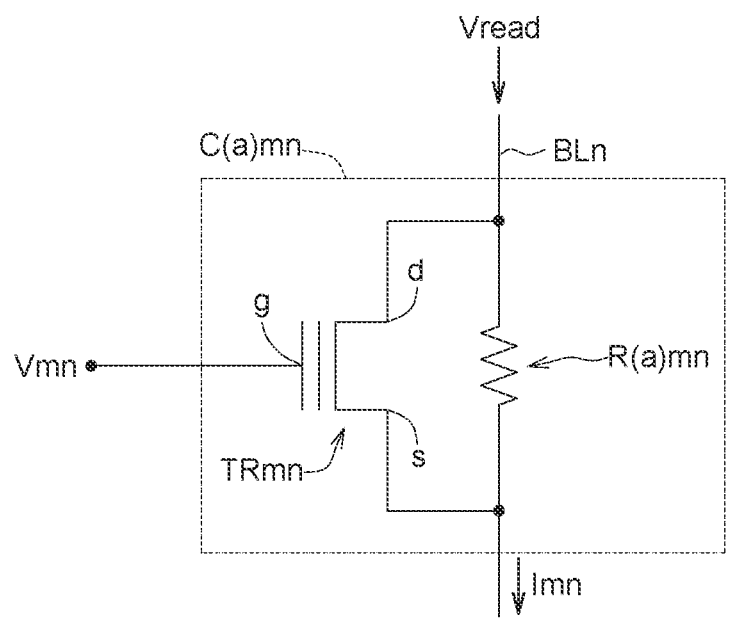
FIG. 3A is a circuit diagram of a computing memory cell of a first embodiment of the application.

FIG. 3A is a circuit diagram of a computing memory cell C(a)mn of a first embodiment of the application. The computing memory cell C(a)mn is used to realize the computing memory cells C11-Cmn of the IMC memory device 100 in FIG. 1. The computing memory cell C(a)mn includes a transistor TRmn and a resistor R(a)mn. The transistor TRmn is coupled to the resistor R(a)mn in parallel, and the resistor R(a)mn has a fixed resistance value. The computing memory cell C(a)mn is coupled to the n-th bit line BLn. The drain d and the source s of the transistor TRmn are coupled to the bit line BLn, and the gate g of the transistor TRmn receives the input voltage Vmn. Resistor R(a)mn is also coupled to bit line BLn.

The transistor TRmn is, for example, a floating gate transistor. The transistor TRmn has a threshold voltage Vt, and a programming voltage may be applied to adjust the voltage value of the threshold voltage Vt. When the transistor TRmn is in an erase state, the voltage value of the threshold voltage Vt is the first threshold voltage value VtL. When the transistor TRmn is in a programming state, the voltage value of the threshold voltage Vt may be programmed as the second threshold voltage value VtH. The second threshold voltage value VtH is greater than the first threshold voltage value VtL. The first threshold voltage value VtL is, for example, 0.4V, and the second threshold voltage value VtH is, for example, 4.8V. Furthermore, the threshold voltage Vt corresponds to the weight value Wmn stored in the computing memory cell C(a)mn. When the threshold voltage Vt is the first threshold voltage value VtL, it corresponds to the weight value Wmn of "0" stored in the computing memory cell C(a)mn. When the threshold voltage Vt is the second threshold voltage value VtH, the corresponding weight value Wmn stored in the computing memory cell C(a)mn is "1".

The gate g of the transistor TRmn may receive an input voltage Vmn. The input voltage Vmn corresponds to the input value INmn received by the computing memory cell C(a)mn. When the voltage value of the input voltage Vmn is the first input voltage value VL, the corresponding input value INmn is "1". When the voltage value of the input voltage Vmn is the second input voltage value VH, the corresponding input value INmn is "0". The second input voltage value VH is greater than the first input voltage value VL. The second input voltage value VH is, for example, 3V. The first input voltage value VL is, for example, −1V. Moreover, the second input voltage value VH is greater than the second threshold voltage value VtH and the first threshold voltage value VtL. Furthermore, the first input voltage value VL is lower than the second threshold voltage value VtH and greater than the first threshold voltage value VlL.

The computing memory cell C(a)mn may receive the read voltage Vread through the bit line BLn for generating the cell current Imn. In operation, in response to the input voltage Vmn and the threshold voltage Vt of different voltage values, the computing memory cell C(a)mn selectively generates the cell current. When the input voltage Vmn received by the computing memory cell C(a)mn is the second input voltage value VH, and the threshold voltage Vt of the transistor TRmn is the first threshold voltage value VtL or the second threshold voltage value VtH, since the input voltage Vmn is greater than the threshold voltage Vt, the transistor TRmn is in a turned-on (i.e., a conducting state). In this case, the computing memory cell C(a)mn generates the cell current Imn. The equivalent impedance of the computing memory cell C(a)mn is the equivalent resistance value Rtr of the transistor TRmn itself in parallel with the resistor R(a)mn. In one example, the resistance value of the resistor R(a)mn is much greater than the equivalent resistance value Rtr of the transistor TRmn, so the equivalent impedance of the computing memory cell C(a)mn is substantially equal to the equivalent resistance value Rtr of the transistor TRmn.

On the other hand, when the input voltage Vmn received by the computing memory cell C(a)mn is the first input voltage value VL, and the threshold voltage Vt of the transistor TRmn is the first threshold voltage value VtL, since the input voltage Vmn is greater than the threshold voltage Vt, the transistor TRmn is in the turned-on state and thus the computing memory cell C(a)mn generates the cell current Imn. In this condition, the equivalent impedance of the computing memory cell C(a)mn is substantially equal to the equivalent resistance value Rtr of the transistor TRmn.

Furthermore, when the input voltage Vmn received by the computing memory cell C(a)mn is the first input voltage value VL and the threshold voltage Vt of the transistor TRmn is the second threshold voltage value VtH, since the input voltage Vmn is lower than the threshold voltage Vt, therefore, the transistor TRmn is in a turned-off state (i.e., an open-circuit state) and thus the computing memory cell C(a)mn generates no cell current. In this situation, the equivalent impedance of the computing memory cell C(a)mn is substantially equal to the resistor R(a)mn.

According to the operation manner of the computing memory cell C(a)mn, Table 1 shows a truth table about whether the computing memory cell C(a)mn generates the cell current Imn, which is corresponding to the input value INmn and the weight value Wmn.

TABLE 1

| INmn | Wmn | |
|---|---|---|
| | 0 | 1 |
| 0 | generating the cell current Imn | generating the cell current Imn |
| 1 | generating the cell current Imn | generating no cell current Imn |

Referring to Table 1, when the input value INmn is "0" and the weight value Wmn is "0" or "1", the computing memory cell C(a)mn generates the cell current Imn. When the input value INmn is "1" and the weight value Wmn is "0", the computing memory cell C(a)mn generates the cell current Imn. When the input value INmn is "1" and the weight value Wmn is "1", the computing memory cell C(a)mn generates no cell current Imn. Accordingly, the computing memory cell C(a)mn may perform a product operation of the input value INmn and the weight value Wmn, and the cell current Imn of the computing memory cell C(a)mn is equal to the product of the input value INmn and the weight value Wmn.

Figure 3B:
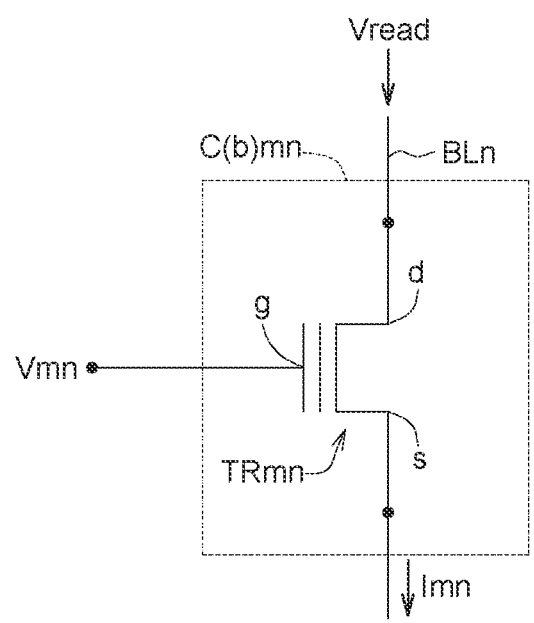
FIG. 3B is a circuit diagram of the computing memory cell of a second embodiment of the application.

FIG. 3B is a circuit diagram of the computing memory cell C(b)mn of the second embodiment of the application. Compared with the computing memory cell C(a)mn in FIG. 3A, the computing memory cell C(b)mn in FIG. 3B only includes a transistor TRmn, and does not include a resistor. The computing memory cell C(b)mn may receive the read voltage Vread through the bit line BLn for generating the cell current Imn. In operation, in response to the input voltage Vmn and the threshold voltage Vt of different voltage values, the computing memory cell C(a)mn selectively generates the cell current.

When the input voltage Vmn received by the computing memory cell C(b)mn is the second input voltage value VH, and the threshold voltage Vt of the transistor TRmn is the first threshold voltage value VtL or the second threshold voltage value VtH, the transistors TRmn are all turned on, the equivalent impedance of the computing memory cell C(b)mn is substantially equal to the equivalent resistance value Rtr of the transistor TRmn itself, and the computing memory cell C(b)mn generates the cell current Imn.

On the other hand, when the input voltage Vmn received by the computing memory cell C(b)mn is the first input voltage value VL, and the threshold voltage Vt of the transistor TRmn is the first threshold voltage value VtL, the transistor TRmn is turned on, and the computing memory cell C(b)mn generates the cell current Imn.

Furthermore, when the input voltage Vmn received by the computing memory cell C(b)mn is the first input voltage value VL and the threshold voltage Vt of the transistor TRmn is the second threshold voltage value VtH, since the input voltage Vmn is lower than the threshold voltage Vt, the transistor TRmn is in an off state, and the computing memory cell C(b)mn generates no cell current Imn.

Table 2 shows a truth table about whether the computing memory cell C(b)mn generates the cell current Imn, which is corresponding to the input value INmn and the weight value Wmn, which are the same as the values shown in Table 1. Accordingly, the computing memory cell C(b)mn may perform a product operation, and the cell current Imn generated by the computing memory cell C(b)mn is equal to a product of the input value INmn and the weight value Wmn.

TABLE 2

| INmn | Wmn | |
|---|---|---|
| | 0 | 1 |
| 0 | generating the cell current Imn | generating the cell current Imn |
| 1 | generating the cell current Imn | generating no cell current Imn |

Figure 4A:
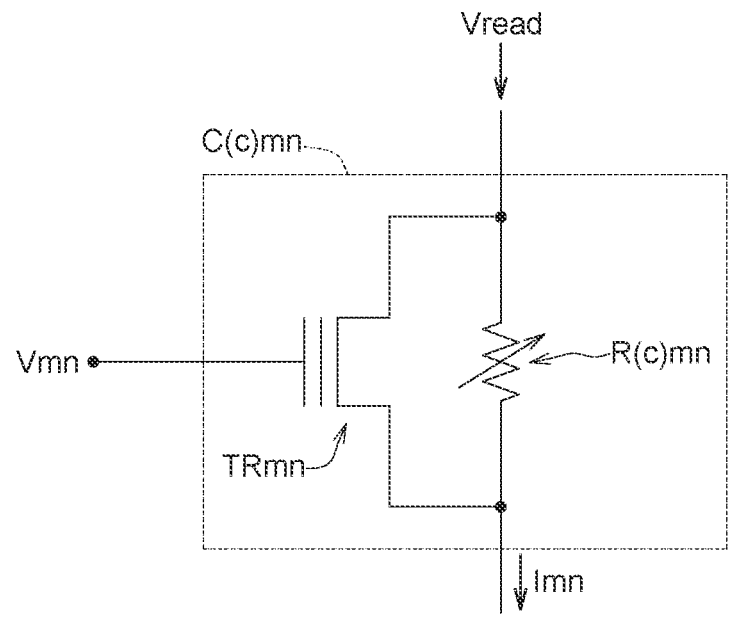
FIG. 4A and FIG. 4B are circuit diagrams of the computing memory cell according to a third embodiment of the application.
Figure 4B:
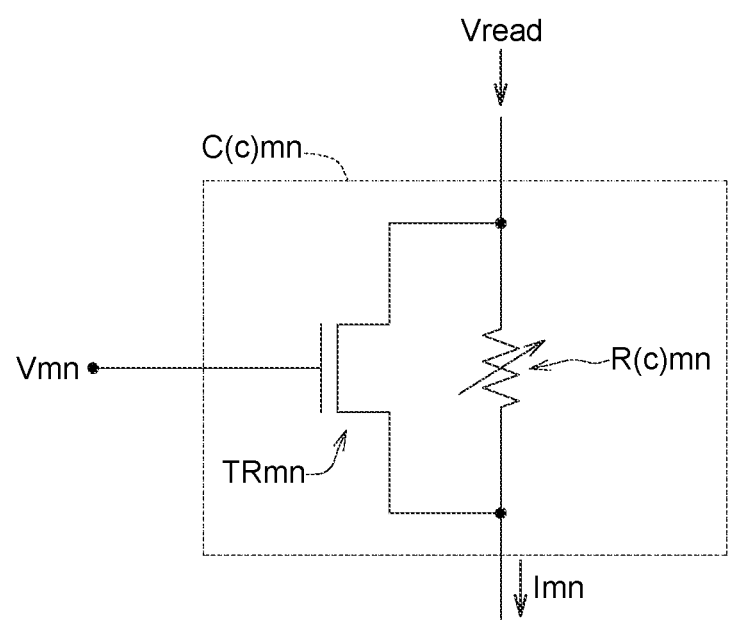

FIG. 4A and FIG. 4B are circuit diagrams of the computing memory cell C(c)mn according to the third embodiment of the application. Compared with the computing memory cell C(a)mn in FIG. 3A, the resistor R(c)mn of the computing memory cell C(c)mn in FIG. 4A and FIG. 4B is a variable resistor, which has a variable resistance value and may be dynamically adjusted during the operation of the memory device 100. In another example, resistor R(c)mn has a fixed resistance value, however, process parameters may be adjusted so as to adjust resistance value of resistor R(c)mn during fabrication. In FIG. 4A, the transistor TRmn is a programmable transistor and in FIG. 4B, the transistor TRmn is a general transistor.

The resistor R(c)mn may be adjusted as, for example, four resistance values R0, R1, R2 and R3. The resistance value R0 approaches zero, and the resistance value R0 is much smaller than the resistance values R1, R2 and R3. In addition, the equivalent resistance value Rtr of the transistor TRmn of the computing memory cell C(c)mn is also much smaller than the resistance values R1, R2 and R3.

When the weight value Wmn stored in the computing memory cell C(c)mn is "0", the resistor R(c)mn is adjusted as the resistance value R0. Similarly, when the weight value Wmn stored in the computing memory cell C(c)mn is "1" "2" and "3", the resistor R(c)mn is adjusted as the resistance values R1, R2 and R3.

When the input value INmn is "0", the input voltage Vmn is the second input voltage value VH of a high voltage value, the transistor TRmn is in the turned-on state, and the equivalent resistance of the computing memory cell C(c)mn is substantially equal to the equivalent resistance value Rtr of the transistor TRmn itself. In this case, regardless of whether the weight value Wmn is set to "0", "1", "2" or "3" (that is, regardless of whether the resistor R(c)mn is adjusted as the resistance value R0, R1, R2 or R3), the computing memory cell C(c)mn generates the cell current Imn.

On the other hand, when the input value INmn is "1", the input voltage Vmn is the first input voltage value VL of a low voltage value, the transistor TRmn is in the turned-off state, and the computing memory cell C(c)mn generates no cell current Imn. When the weight value Wmn is set as "0", "1", "2" and "3", the resistor R(c)mn is adjusted as the resistance values R0, R1, R2 and R3, and the cell current Imn generated from the computing memory cell C(c)mn is corresponding to the resistance values R0, R1, R2 and R3 respectively. Accordingly, the computing memory cell C(c)mn may perform a product operation, and the cell current Imn generated from the computing memory cell C(c)mn is equal to a product of the input value INmn and the weight value Wmn.

Figure 5:
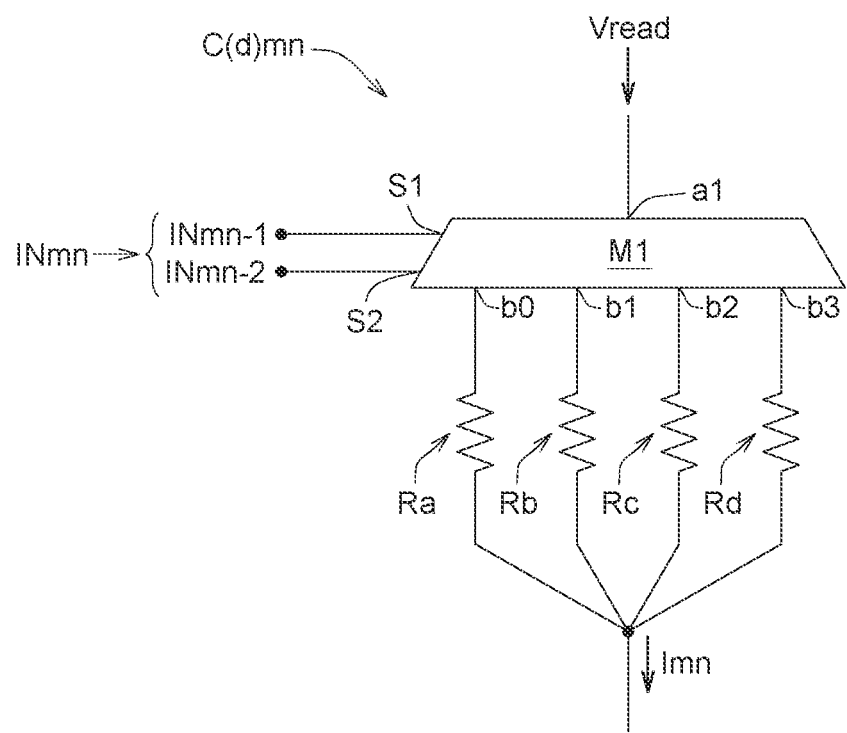
FIG. 5 is a circuit diagram of the computing memory cell according to a fourth embodiment of the application.

FIG. 5 is a circuit diagram of the computing memory cell C(d)mn according to the fourth embodiment of the application. As shown in FIG. 5, the computing memory cell C(d)mn includes a multiplexer M1 and resistors Ra, Rb, Rc and Rd. The multiplexer M1 has one input terminal a1, four output terminals b0, b1, b2 and b3, and two control terminals S1 and S2. The input terminal a1 is coupled to the bit line to receive the read voltage Vread. The control terminals S1 and S2 are coupled to a set of word lines to receive the input signals INmn-1 and INmn-2. For example, the control terminal S1 receives the input signal INmn-1 through the first word line, and the control terminal S2 receives the input signal INmn-2 through the second word line. According to the input signals INmn-1 and INmn-2, the multiplexer M1 selectively applies the read voltage Vread to one of the resistors Ra, Rb, Rc and Rd via one of the output terminals b0, b1, b2 and b3.

In operation, the input value INmn of the computing memory cell C(d)mn corresponds to the two-bit input signals INmn-1 and INmn-2. The input value INmn is "0", corresponding to the input signals INmn-1 and INmn-2 of "0 0", so as to control the multiplexer M1 to apply the read voltage Vread to the resistor Ra. In this case, the computing memory cell C(d)mn generates the cell current Imn equal to (Vread/Ra). Similarly, the input value INmn is "1", "2" and "3", corresponding to the input signals INmn-1 and INmn-2 of "0 1", "1 0" and "1 1", the read voltage Vread is applied to the resistors Rb, Rc and Rd respectively. The cell current Imn is equal to (Vread/Rb), or (Vread/Rc) or (Vread/Rd).

The computing memory cell C(d)mn may store the weight value Wmn, and correspondingly adjust the resistance values of the resistors Ra, Rb, Rc and Rd according to the weight value Wmn. That is, the weight value Wmn corresponds to different resistance values of the resistors Ra, Rb, Rc and Rd.

Figure 6:
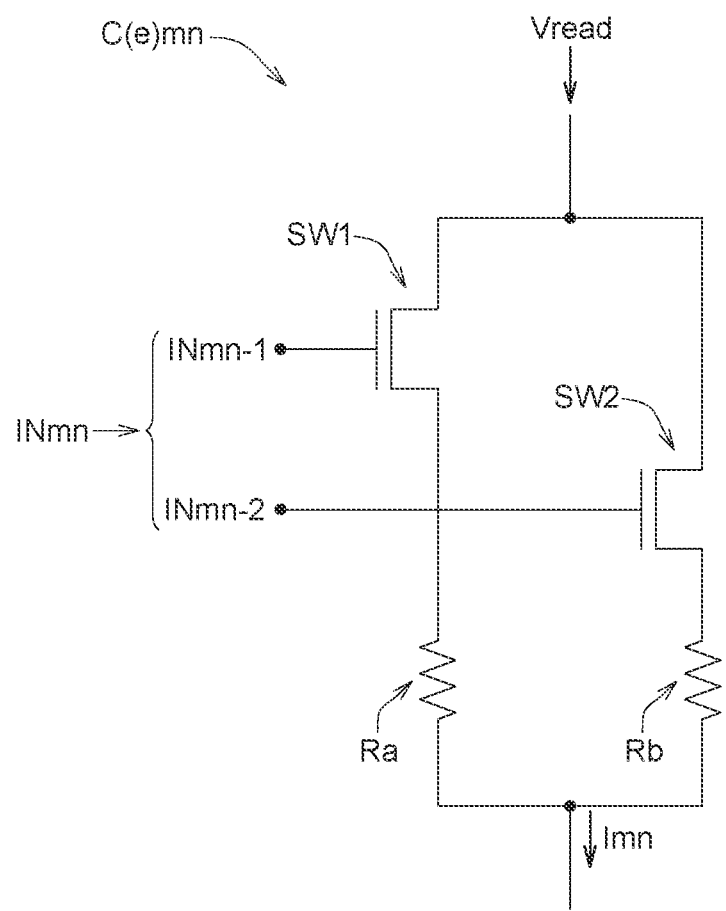
FIG. 6 is a circuit diagram of the computing memory cell according to a fifth embodiment of the application.

FIG. 6 is a circuit diagram of the computing memory cell C(e)mn according to the fifth embodiment of the application. As shown in FIG. 6, the computing memory cell C(e)mn includes switch elements SW1 and SW2 and resistors Ra and Rb. In one example, the switch elements SW1 and SW2 are NMOS transistors, which receive the input signals A1 and A1' through the gates of the transistors. The operation of the switch elements SW1 and SW2 in this embodiment is similar to a multiplexer, which is similar to multiplexer M1 in the embodiment of FIG. 5. That is, in this embodiment of FIG. 6, the multiplexer is realized by the switch elements SW1 and SW2.

The input signals INmn-1 and INmn-2 correspond to the input value INmn of the computing memory cell C(e)mn. The input value INmn of "0" corresponds to the input signals INmn-1 and INmn-2 of "0 1", the switch element SW1 is in a turned-off state and the switch element SW2 is in a turned-on state. In this case, the read voltage Vread only applies to through the resistor Rb through the switch element SW2, and the cell current Imn generated by the computing memory cell C(e)mn is (Vread/Rb). The computing memory cell C(e)mn may store the weight value Wmn, and adjust the resistors Ra and Rb as the first resistance value RL or the second resistance value RH according to the weight value Wmn, respectively. Wherein, the second resistance value RH is greater than the first resistance value RL.

On the other hand, the input value INmn of "1" corresponds to the input signals INmn-1 and INmn-2 of "1 0", the switch element SW1 is in the turned-on state and the switch element SW2 is in the turned-off state. The read voltage Vread only applied to the resistor Ra through the switch element SW1, and the cell current Imn generated by the computing memory cell C(e)mn is (Vread/Ra).

Figure 7:
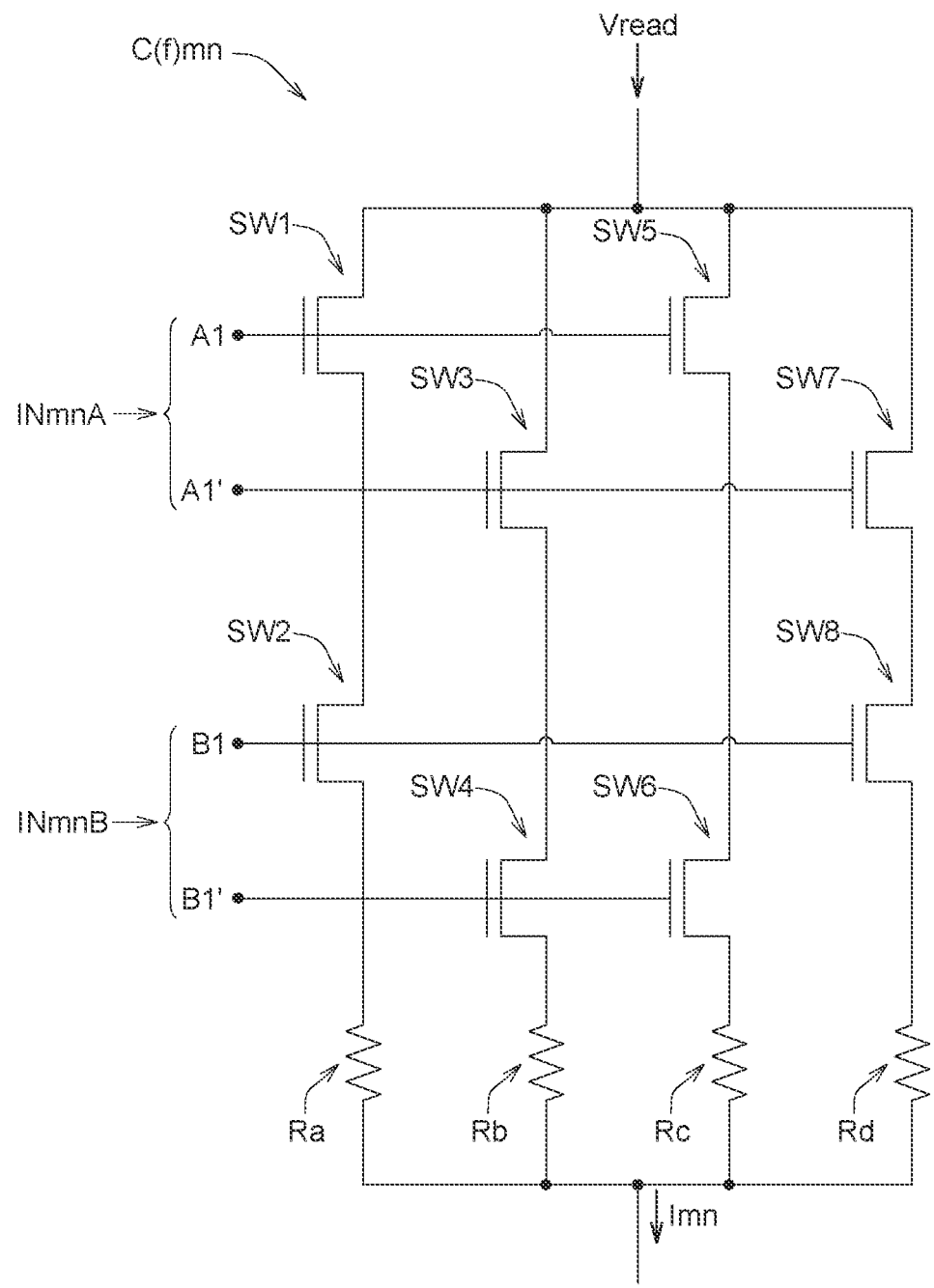
FIG. 7 is a circuit diagram of the computing memory cell according to a sixth embodiment of the application.

FIG. 7 is a circuit diagram of the computing memory cell C(f)mn according to the sixth embodiment of the application. Compared with the computing memory cell C(e)mn in FIG. 6 that receives a one-bit input value INmn to perform an operation, the computing memory cell C(f)mn in FIG. 7 receives a two-bit input value [INmnA INmnB] to perform the operation. As shown in FIG. 7, the computing memory cell C(f)mn includes eight switch elements SW1 to SW8 and four resistors Ra, Rb, Rc and Rd. The first set of switch elements SW1 and SW2 are coupled to the resistor Ra in series, the second set of switch elements SW3 and SW4 are coupled to the resistor Rb in series, the third set of switch elements SW5 and SW6 are coupled to the resistor Rc in series, and the fourth set of switches SW7 and SW8 are coupled to the resistor Rd in series.

The switch elements SW1 and SW5 are coupled to a word line to receive the input signal A1. The switch elements SW3 and SW7 are coupled to an inverted word line to receive the input signal A1'. The switch elements SW2 and SW8 are coupled to another word line to receive the input signal B1. The switch elements SW4 and SW6 are coupled to another inverted word line to receive the input signal B1'. The input signal A1' is the inversion of the input signal A1, and the input signal B1' is the inversion of the input signal B1. The switch elements SW1, SW3, SW5, and SW7 are coupled to the bit line to receive the read voltage Vread. The switch elements SW1 to SW8 are, for example, NMOS transistors, and receive the input signals A1, A1', B1 and B1' through the gates of the transistors. In this embodiment, switch elements SW1 to SW8 are used to implement the multiplexer, and functions of the switch elements SW1-SW8 are similar to the multiplexer M1 in FIG. 5. The switch elements SW1-SW8 are respectively controlled to be turned on or off, by the input values INmnA and INmnB. Hence, the read voltage Vread selectively applies to one of the resistors Ra-Rd through the switch elements SW1-SW8.

The input value INmnA corresponds to the input signals A1 and A1', and the input value INmnB corresponds to the input signals B1 and B1'. The input values INmnA and INmnB being "0 0" correspond to the input signals A1, A1', B1 and B1' being "0 1 0 1". In this case, the switch elements SW3, SW7, SW4 and SW6 are turned on, and the switch elements SW1, SW5, SW2 and SW8 are turned off. The read voltage Vread applies to the resistor Rb through the switch elements SW3 and SW4, and the corresponding cell current Imn generated by the computing memory cell C(f)mn is (Vread/Rb).

The input values INmnA and INmnB being "0 1" correspond to the input signals A1, A1', B1 and B1' being "0 1 1 0", in this case the switch elements SW3, SW7, SW2 and SW8 are turned-on and the switch elements SW1, SW5, SW4 and SW6 are turned-off. The read voltage Vread applies to the resistor Rd through the switch elements SW7 and SW8, and the corresponding cell current Imn generated by the computing memory cell C(f)mn is (Vread/Rd).

The input values INmnA and INmnB being "1 0" correspond to the input signals A1, A1', B1 and B1' being "1 0 0 1". In this case, the switch elements SW1, SW5, SW4 and SW6 are turned-on, while SW3, SW7, SW2 and SW8 are turned-off. The read voltage Vread applies to the resistor Rc through the switch elements SW5 and SW6, and the corresponding cell current Imn generated by the computing memory cell C(f)mn is (Vread/Rc).

The input values INmnA and INmnB being "1 1" correspond to the input signals A1, A1', B1 and B1' being "1 0 1 0". In this case, the switch elements SW1, SW5, SW2 and SW8 are turned-on, while SW3, SW7, SW4 and SW6 are turned-off, the read voltage Vread applies to the resistor Ra through the switch elements SW1 and SW2. The corresponding cell current Imn generated by the computing memory cell C(f)mn is (Vread/Ra).

According to the above calculation, Table 3 shows the cell current Imn generated by the computing memory cell C(f)mn when different input values INmnA and INmnB are provided.

TABLE 3

| | | Imn |
|---|---|---|
| INmnA INmnB = [0 0] | A1 A1' B1 B1' = [0 1 0 1] | Imn = (Vread/Rb) |
| INmnA INmnB = [0 1] | A1 A1' B1 B1' = [0 1 1 0] | Imn = (Vread/Rd) |
| INmnA INmnB = [1 0] | A1 A1' B1 B1' = [1 0 0 1] | Imn = (Vread/Rc) |
| INmnA INmnB = [1 1] | A1 A1' B1 B1' = [1 0 1 0] | Imn = (Vread/Ra) |

The computing memory cell C(f)mn may store the weight value Wmn and adjust the resistance values of the resistors Ra, Rb, Rc and Rd according to the weight value Wmn. In one example, similar to adjustment of the resistance value of the computing memory cell C(d)mn in FIG. 5, when the weight value Wmn is "0", the resistors Ra, Rb, Rc and Rd are all adjusted as the resistance value R0. When the weight value Wmn is "1", the resistors Ra, Rb, Rc and Rd are adjusted as the resistance values R3, R0, R2 and R1, respectively. When the weight value Wmn is "2", the resistors Ra, Rb, Rc and Rd are adjusted as 2*R3, 2*R0, 2*R2, and 2*R1 respectively. When the weight value Wmn is "3", the resistors Ra, Rb, Rc and Rd are adjusted as 3*R3, 3*R0, 3*R2 and 3*R1 respectively. Accordingly, the computing memory cell C(f)mn of this embodiment may perform a product operation. In other examples, the resistance values of the resistors Ra, Rb, Rc and Rd may be modulated according to the weight value Wmn, so that the computing memory cell C(f)mn performs different types of logic operations.

Figure 8:
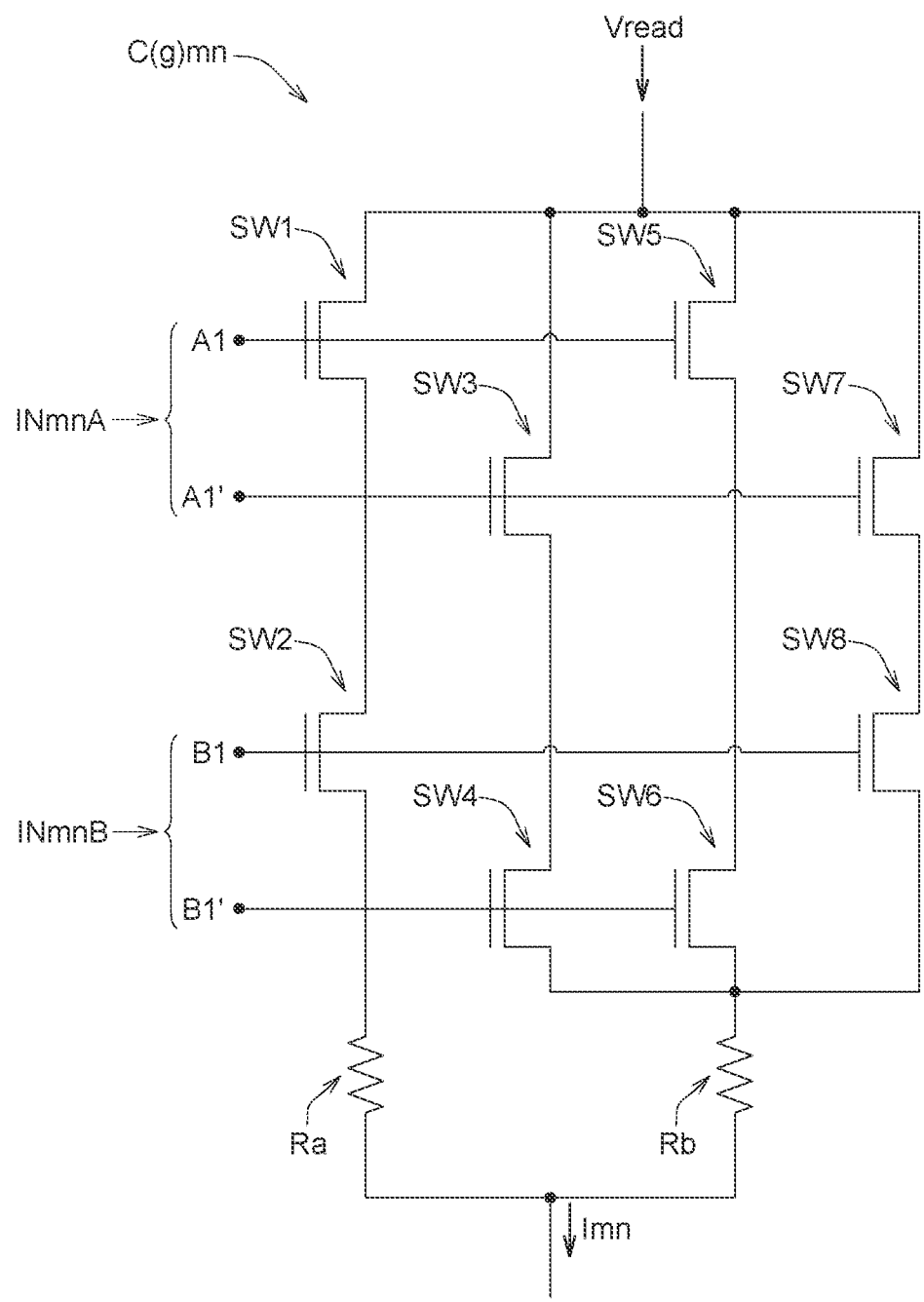
FIG. 8 is a circuit diagram of a computing memory cell according to a seventh embodiment of the application.

FIG. 8 is a circuit diagram of a computing memory cell C(g)mn according to a seventh embodiment of the application. When the resistor Rb, resistor Rc and resistor Rd of the computing memory cell C(f)mn have equal resistance value, the resistor Rb, resistor Rc and resistor Rd may be integrated as a single equivalent resistor, to simplified as the computing memory cell C(g)mn of this embodiment. The resistor Rb of the computing memory cell C(g)mn is the equivalent resistor after integration. The switch elements SW4, SW6 and SW8 are coupled to the resistor Rb.

The input values INmnA and INmnB of the computing memory cell C(g)mn are "0 0", which correspond to the input signals A1, A1', B1 and B1' being "0 1 0 1". In this case, the switch element SW3, SW7, SW4 and SW6 are turned on, while the switch elements SW1, SW5, SW2 and SW8 are turned off. The read voltage Vread is applied to the resistor Rb through the switch elements SW3 and SW4. Similarly, the input values INmnA and INmnB being "0 1" correspond to the input signals A1, A1', B1 and B1' being "0 1 1 0". In this case, the switch elements SW3, SW7, SW2 and SW8 are turned-on, while the switch elements SW1, SW5, SW4 and SW6 are turned off. The read voltage Vread is applied to the resistor Rb through the switch elements SW7 and SW8. The input values INmnA and INmnB being "1 0" correspond to the input signals A1, A1', B1 B1' being "1 0 0 1". In this case, the switch elements SW1, SW5, SW4 and SW6 are turned-on, and SW3, SW7, SW2 and SW8 are turned-off, and the read voltage Vread is applied to the resistor Rb through the switch elements SW5 and SW6. From the above, when the input values INmnA and INmnB are "0 0", "0 1" and "1 0", the read voltage Vread is applied to the resistor Rb, so that the computing memory cell C(f)mn generates the cell current Imn Imn=(Vread/Rb).

On the other hand, when the input values INmnA and INmnB are "1 1", which corresponds to the input signals A1, A1', B1 and B1' being "1 0 1 0", the switch elements SW1, SW5, SW2 and SW8 are turned-on, and SW3, SW7, SW4 and SW6 are turned-off. The read voltage Vread is applied to the resistor Ra through the switch elements SW1 and SW2, so that the computing memory cell C(f)mn generates the cell current Imn=(Vread/Ra).

The resistances Ra and Rb may be adjusted as the second resistance value RH or the first resistance value RL respectively, so that the computing memory cell C(f)mn performs different types of logic operations. In an example, the resistor Ra is adjusted as the second resistance value RH, the resistor Rb is adjusted as the first resistance value RL, the second resistance value RH is greater than the first resistance value RL. The computing memory cell C(g)mn may perform a logical "AND" operation of the input value INmnA and the input value INmnB, as shown in Table 4, wherein "Yn" refers to the logical operation result of the input value INmnA and the input value INmnB.

TABLE 4

| | | Wmn = 0 | |
|---|---|---|---|
| Logic AND operation | | Imn | Yn |
| INmnA INmnB = [0 0] | A1A1'B1B1' = [0 1 0 1] | Vread/Rb = Vread/RL | 0 |
| INmnA INmnB = [0 1] | A1A1'B1B1' = [0 1 1 0] | Vread/Rb = Vread/RL | 0 |
| INmnA INmnB = [1 0] | A1A1'B1B1' = [1 0 0 1] | Vread/Rb = Vread/RL | 0 |
| INmnA INmnB = [1 1] | A1A1'B1B1' = [1 0 1 0] | Vread/Ra = Vread/RH | 1 |

In another example, the resistor Ra is adjusted as the first resistance value RL, and the resistor Rb is adjusted as the second resistance value RH, then the computing memory cell C(g)mn may perform the logic "NAND" operation of input value INmnA and the input value INmnB, as shown in Table 5.

TABLE 5

| Logic NAND operation | | Wmn = 0 | |
|---|---|---|---|
| | | Imn | Yn |
| INmnA INmnB = [0 0] | A1A1'B1B1' = [0 1 0 1] | Vread/Rb = Vread/RH | 1 |
| INmnA INmnB = [0 1] | A1A1'B1B1' = [0 1 1 0] | Vread/Rb = Vread/RH | 1 |
| INmnA INmnB = [1 0] | A1A1'B1B1' = [1 0 0 1] | Vread/Rb = Vread/RH | 1 |
| INmnA INmnB = [1 1] | A1A1'B1B1' = [1 0 1 0] | Vread/Ra = Vread/RL | 0 |

Figure 9:
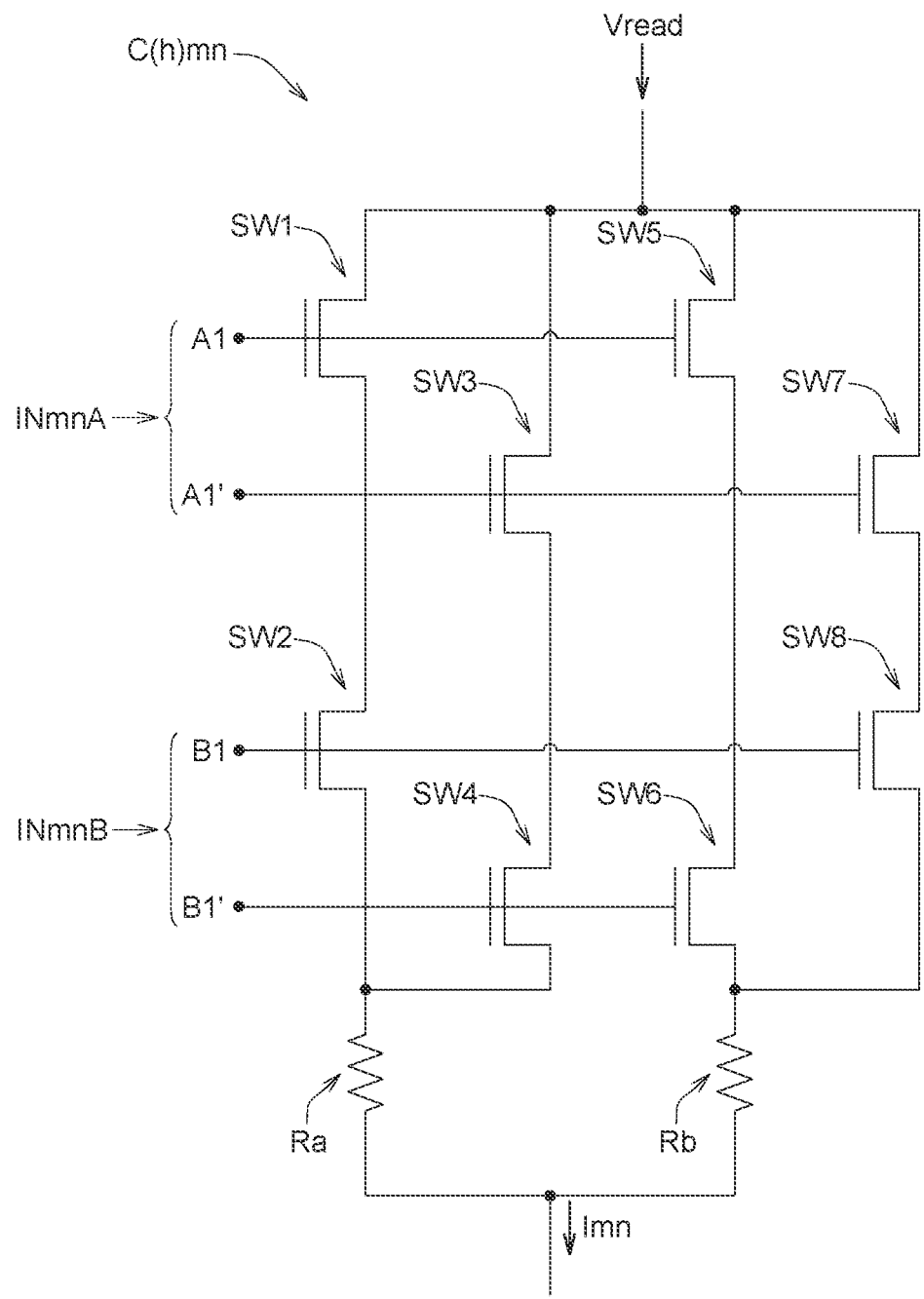
FIG. 9 is a circuit diagram of the computing memory cell according to an eighth embodiment of the application.

FIG. 9 is a circuit diagram of the computing memory cell C(h)mn according to an eighth embodiment of the application. When the resistor Ra and resistor Rb of memory cell C(f)mn of FIG. 7 have equal resistance value, the resistor Ra and resistor Rb may be integrated as a single first equivalent resistor, and when the resistor Rc and resistor Rd of memory cell C(f)mn of FIG. 7 have equal resistance value, the resistor Rc and resistor Rd may be integrated as a single second equivalent resistor. Accordingly, the resistor Ra of the computing memory cell C(h)mn of FIG. 9 is the first equivalent resistor after integration, and the resistor Rb of the computing memory cell C(h)mn of FIG. 9 is the second equivalent resistor after integration. The switch elements SW2 and SW4 are coupled to the resistor Ra, and the switch elements SW6 and SW8 are coupled to the resistor Rb.

When the input values INmnA and INmnB are "0 0" which correspond to the input signals A1, A1', B1 and B1' being "0 1 0 1", the read voltage Vread is applied to the resistor Ra through the switch elements SW3 and SW4. When the input values INmnA and INmnB are "1 1" which correspond to the input signals A1, A1', B1 and B1' being "1 0 1 0", the read voltage Vread is applied to the resistor Ra through the switch elements SW1 and SW2.

On the other hand, when the input values INmnA and INmnB are "1 0" which correspond to the input signals A1, A1', B1 and B1' being "1 0 0 1", the read voltage Vread is applied to the resistor Rb through the switch elements SW5 and SW6. When the input values INmnA and INmnB are "0 1" which correspond to the input signals A1, A1', B1 and B1' being "0 1 1 0", the read voltage Vread is applied to the resistor Rb through the switch elements SW7 and SW8.

In an example, the resistor Ra is adjusted as the second resistance value RH, the resistor Rb is adjusted as the first resistance value RL, the second resistance value RH is greater than the first resistance value RL, and the computing memory cell C(h)mn may perform the logic "XNOR" between the input value INmnA and the input value INmnB, as shown in Table 6.

TABLE 6

| Logic XNOR operation | | Wmn = 0 | |
|---|---|---|---|
| | | Imn | Yn |
| INmnA INmnB = | A1A1'B1B1' = [0 1 0 1] | Vread/Ra = Vread/RH | 1 |

TABLE 6-continued

| Logic XNOR operation | | Wmn = 0 | |
|---|---|---|---|
| | | Imn | Yn |
| [0 0] INmnA INmnB = [0 1] | A1A1'B1B1' = [0 1 1 0] | Vread/Rb = Vread/RL | 0 |
| INmnA INmnB = [1 0] | A1A1'B1B1' = [1 0 0 1] | Vread/Rb = Vread/RL | 0 |
| INmnA INmnB = [1 1] | A1A1'B1B1' = [1 0 1 0] | Vread/Ra = Vread/RH | 1 |

In another example, the resistor Ra is adjusted as the first resistance value RL, the resistor Rb is adjusted as the second resistance value RH, and the computing memory cell C(h)mn may perform the logic "XOR" operation between the input value INmnA and the input value INmnB, as shown in Table 7.

TABLE 7

| Logic XOR operation | | Wmn = 0 | |
|---|---|---|---|
| | | Imn | Yn |
| INmnA INmnB = [0 0] | A1A1'B1B1' = [0 1 0 1] | Vread/Ra = Vread/RL | 0 |
| INmnA INmnB = [0 1] | A1A1'B1B1' = [0 1 1 0] | Vread/Rb = Vread/RH | 1 |
| INmnA INmnB = [1 0] | A1A1'B1B1' = [1 0 0 1] | Vread/Rb = Vread/RH | 1 |
| INmnA INmnB = [1 1] | A1A1'B1B1' = [1 0 1 0] | Vread/Ra = Vread/RL | 0 |

According to various embodiments of the application described above, the computing memory cell includes one or more transistors and/or resistors. The threshold voltage of the transistor may be adjusted to change the weight value stored in the computing memory cell, and the resistor(s) may be adjusted to have a high resistance value, a low resistance value or resistance values with different ratios, according to the weight value. In addition, according to the input voltage corresponding to the input value, the computing memory cell is controlled to operate in the "ON state" or the "OFF state", hence the read voltage selectively applies to the transistor or the resistor, so that the computing memory cell generates a corresponding cell current to represent the output value. The output value represents a result of a product operation of the input value and the weight value, and may be summed-up to obtain a sum of the products. In addition, the computing memory cell may also include a multiplexer. Through the operation of the multiplexer, the read voltage selectively applies to the resistor on the selected path, so that the computing memory cell may perform a logic operation of the input value and the weight value, or perform a logic operation between two bits of the input values.

FIG. 10A to FIG. 10D show a simulation diagram according to one embodiment of the application. In FIG. 10A to FIG. 10D, the delay time and the sum-of-product results under one memory string, two memory strings, four memory strings and eight memory strings (each memory string including 32 cascaded computing memory cells) are simulated respectively. Thus, the number of the input values is 32 input values, 64 input values, 128 input values and 256 input values, respectively. The resistance value of the computing memory cell is for example 20K ohm. In FIG. 10A to FIG. 10D, the capacitance value CL of the loading capacitor C is 1 pF, 4 pF and 10 pF. In one embodiment of the application, the capacitance value CL of the loading capacitor C is adjustable to adjust the delay time. In the following, the read voltage is 0.5V while the delay time is defined as the timing when the capacitor voltage VC of the loading capacitor C is charged to the predetermined voltage being 0.3V as an example, which is not to limit the application. The predetermined voltage is determined based on the read voltage.

Figure 10A:
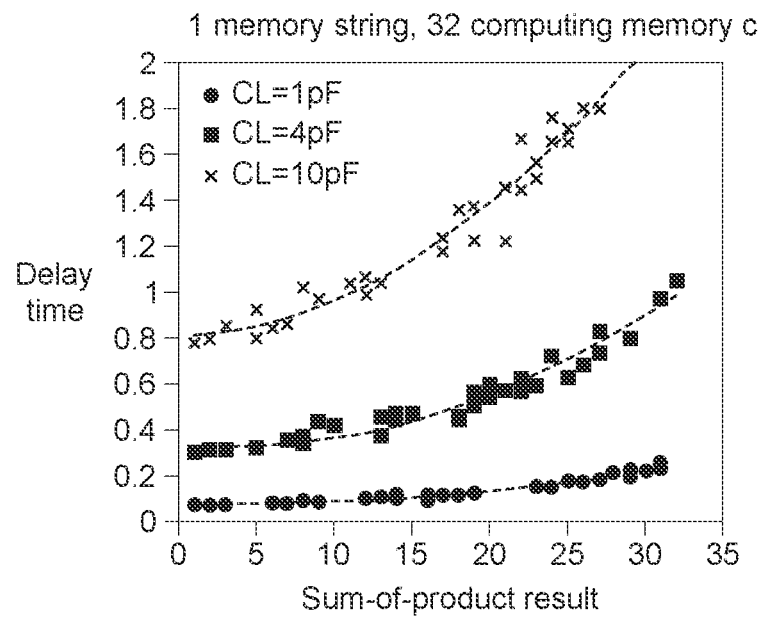
FIG. 10A to FIG. 10D show a simulation diagram according to one embodiment of the application.
Figure 10B:
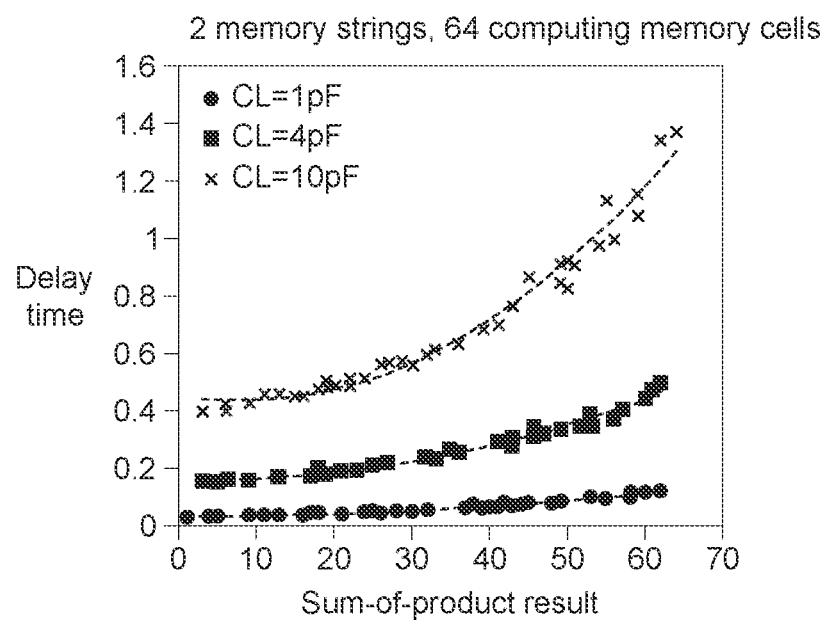
Figure 10C:
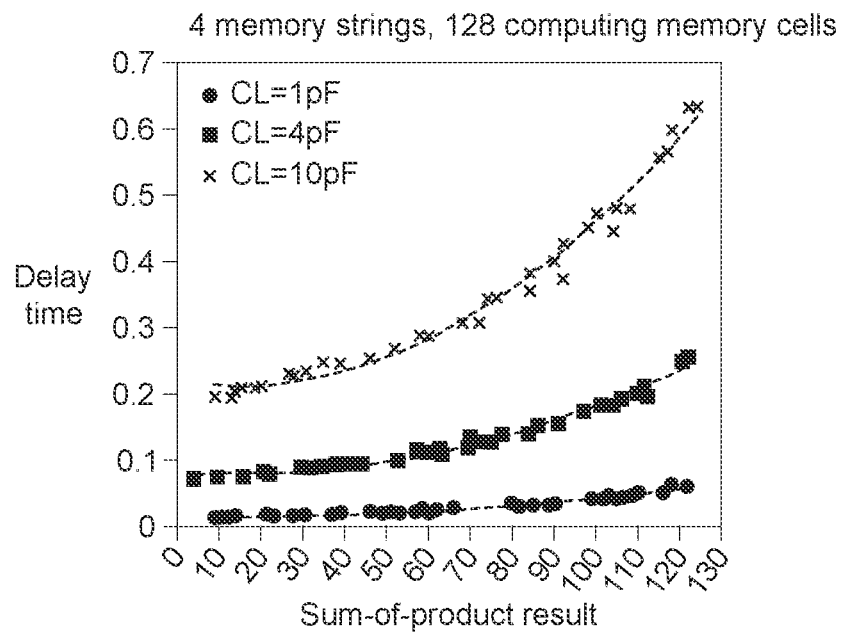
Figure 10D:
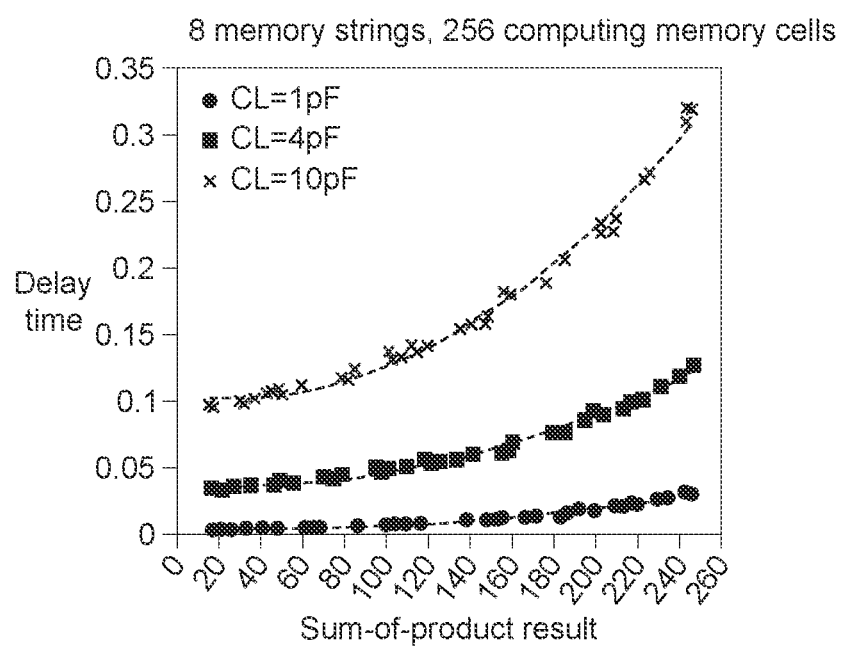
Figure 11A:
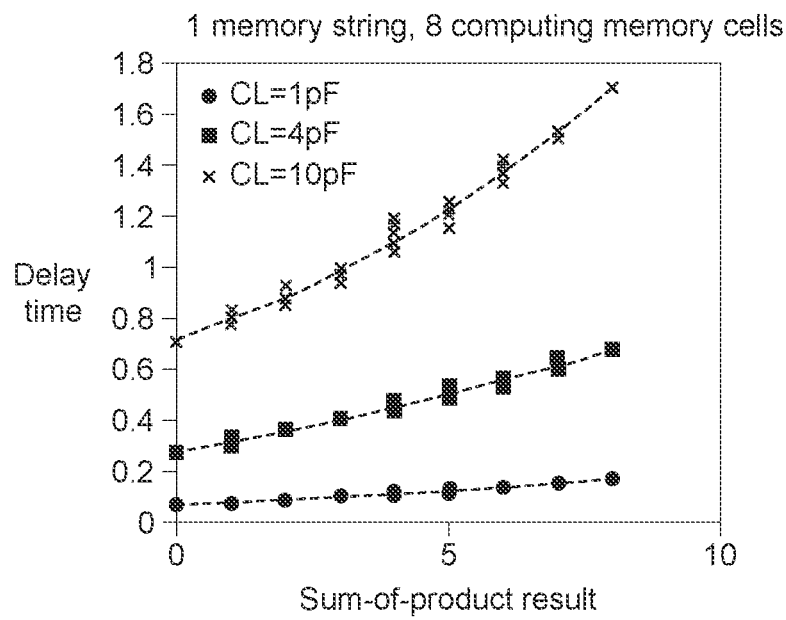
FIG. 11A to FIG. 11D show another simulation diagram according to one embodiment of the application.
Figure 11B:
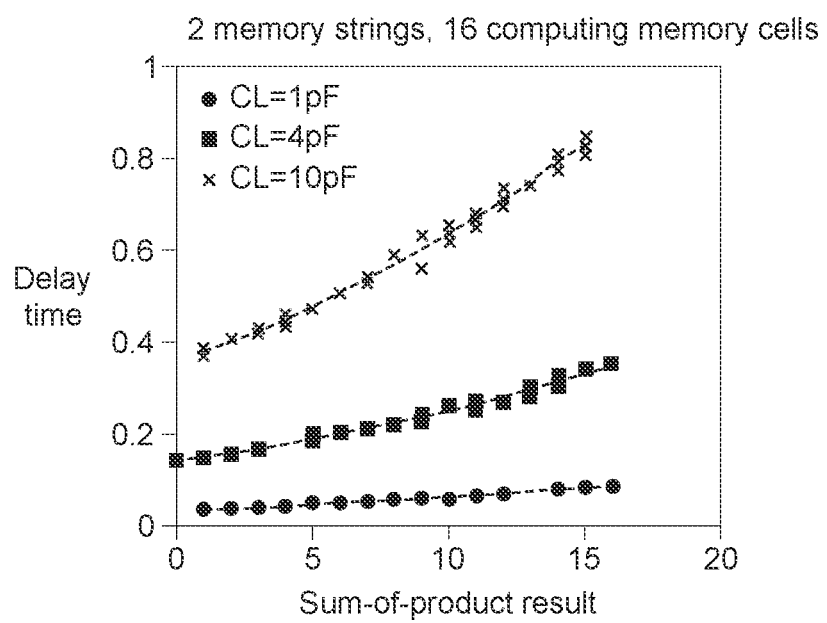
Figure 11C:
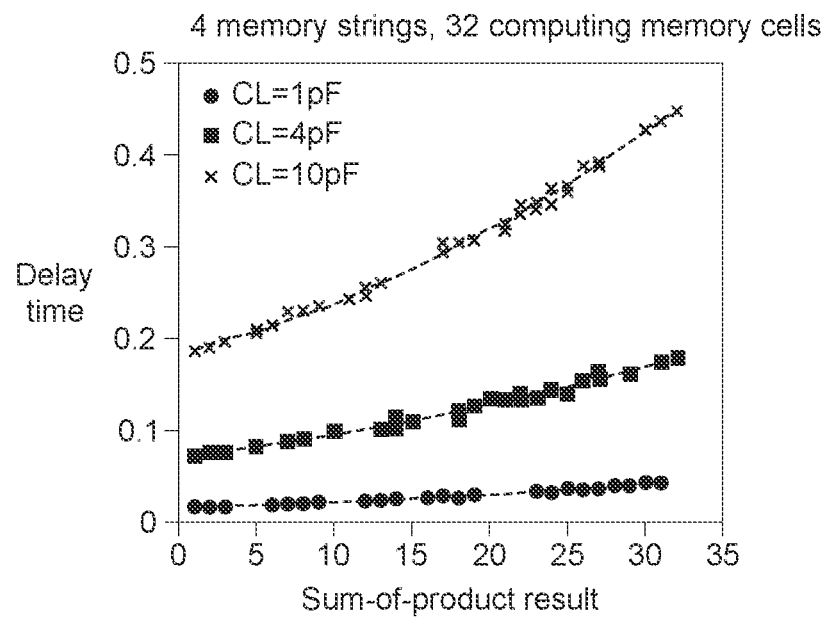
Figure 11D:
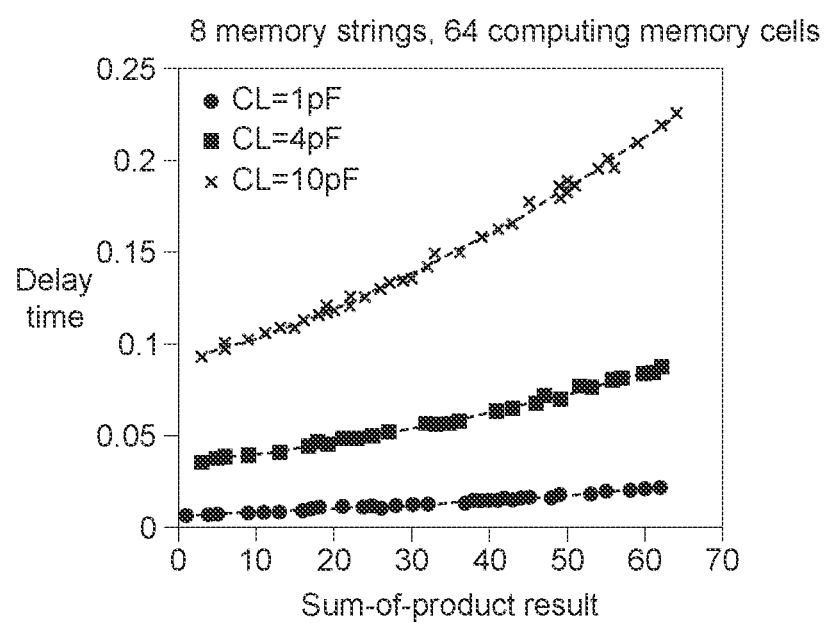

As shown in FIG. 10A, in the case that he capacitance value CL of the loading capacitor C is 10 pF, when the delay time is 1 µ/s, then the sum-of-product result of a single memory string (including 32 cascaded computing memory cells) is 5, and others are so on.

From FIG. 10A to FIG. 10D, in one embodiment of the application, the delay time increase proportionally with the sum-of-product result.

FIG. 11A to FIG. 11D show another simulation diagram according to one embodiment of the application. In FIG. 11A to FIG. 11D, the delay time and the sum-of-product results under one memory string, two memory strings, four memory strings and eight memory strings (each memory string including 8 cascaded computing memory cells) are simulated respectively. Thus, the number of the input values is 8 input values, 16 input values, 32 input values and 64 input values, respectively. The resistance value of the computing memory cell is for example 50K ohm.

From FIG. 11A to FIG. 11D, in one embodiment of the application, the delay time increase proportionally with the sum-of-product result.

Figure 12:
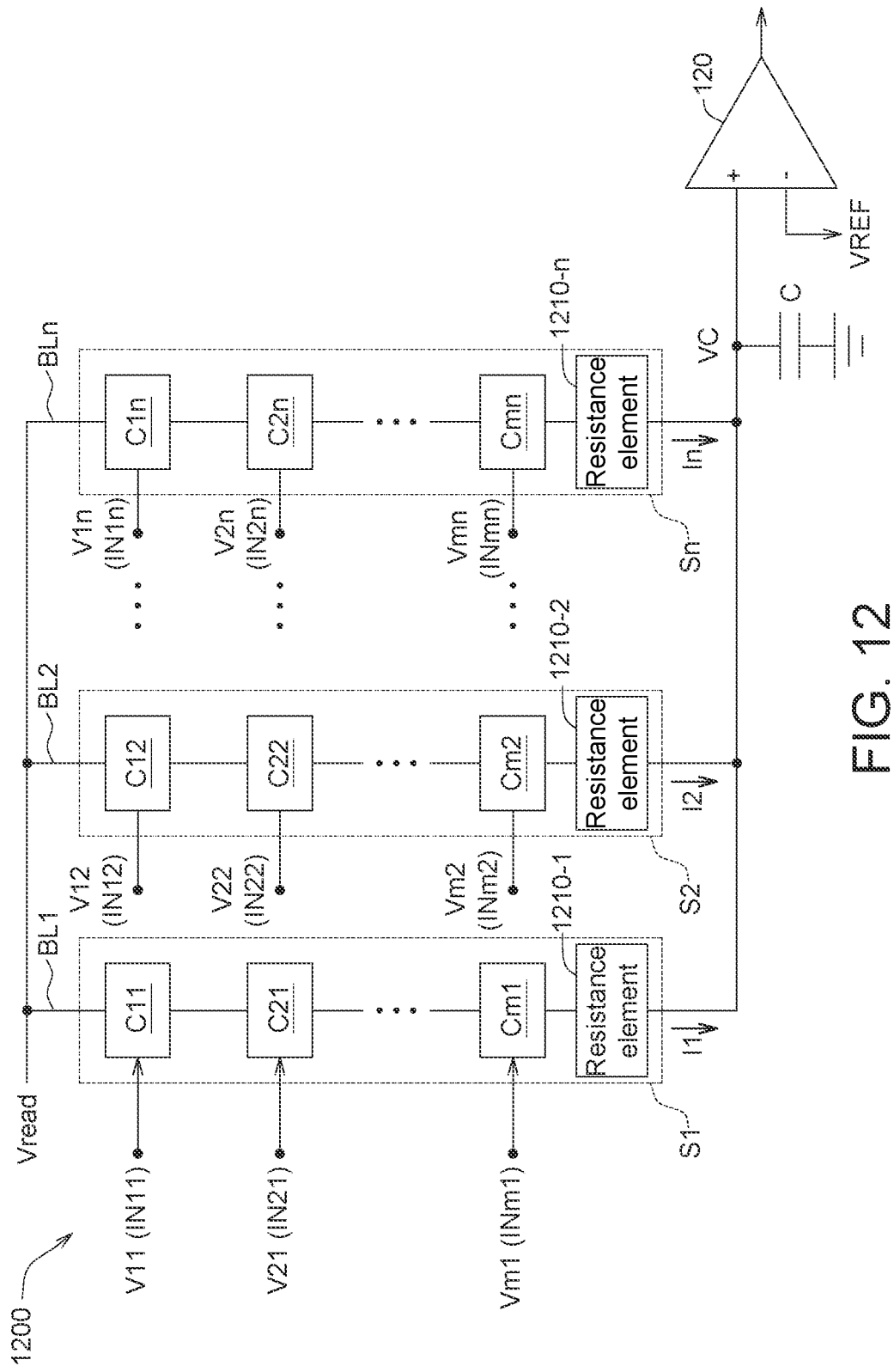
FIG. 12 is a schematic diagram of an IMC memory device of one embodiment of the application.

FIG. 12 is a schematic diagram of an IMC memory device of one embodiment of the application. As shown in FIG. 12, the IMC memory device 1200 according to one embodiment of the application includes: a plurality of computing memory cells C11~Cmn, a plurality of resistance elements 1210-1~1210-n, a loading capacitor C and a measurement circuit 120. The resistance elements 1210-1~1210-n are formed in the memory strings S1~Sn. The resistance elements 1210-1~1210-n are serially coupled to the computing memory cells C11~Cmn. For example, in the memory string S1, the resistance element 1210-1 is serially coupled to the computing memory cells C11, C21, . . . , Cm1.

Figure 13A:
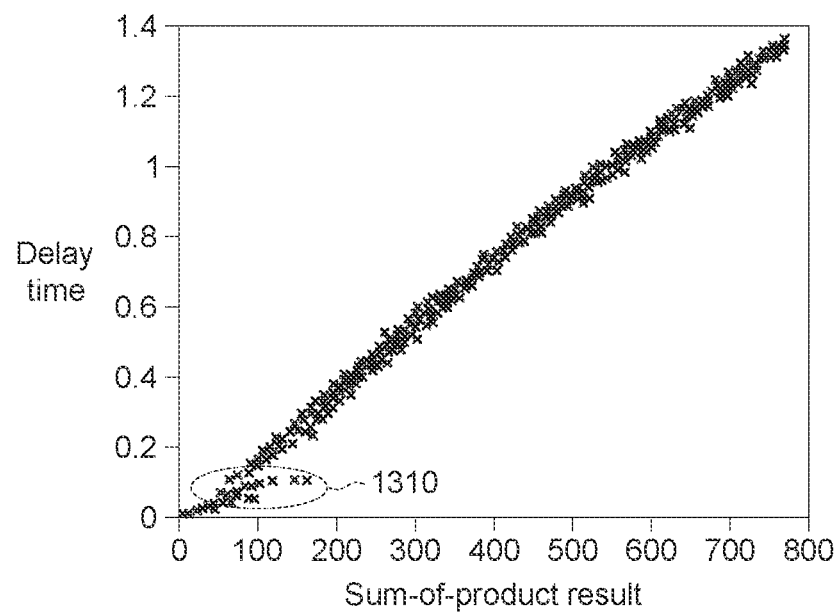
FIG. 13A and FIG. 13B show fast charging behavior.
Figure 13B:
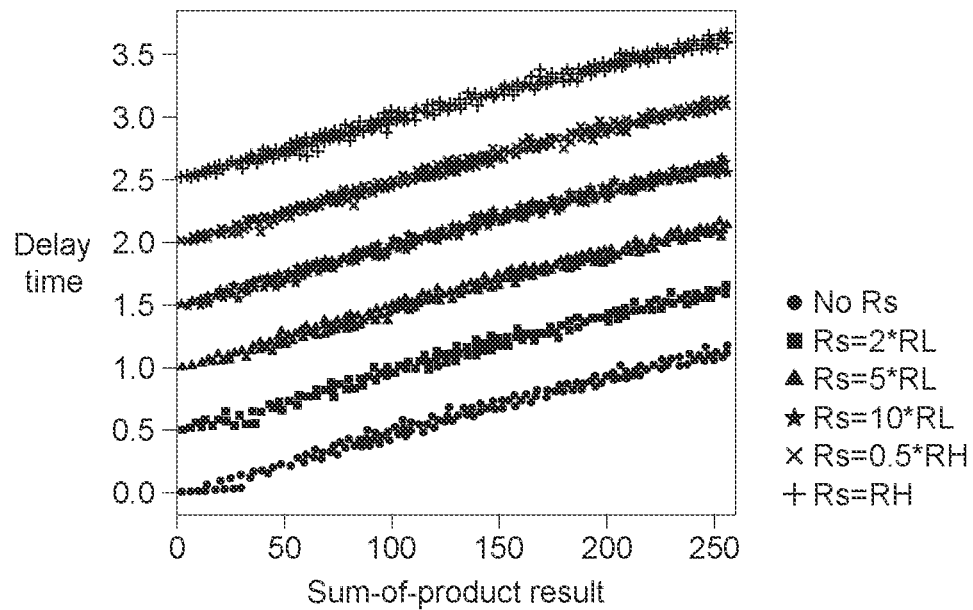

FIG. 13A and FIG. 13B show fast charging behavior.

In one embodiment of the application, the fast charging behavior has occurred, as shown by the reference symbol 1310 in FIG. 13A. The fast charging behavior refers to that, when all computing memory cells in the same memory string are all in low resistance states, the same memory string has a low equivalent resistance, and thus the memory string generates a too high string current. The too high string current charges the loading capacitor C and thus the voltage level of the loading capacitor C is raised rapidly. Therefore, an error determination may be occurred.

Therefore, in one embodiment of the application, the resistance elements 1210-1~1210-n are additionally formed in the memory strings S1~Sn to increase the equivalent resistance of the memory strings S1~Sn for effectively preventing or eliminating the fast charging behavior. Thus, even when all computing memory cells in the same memory string are all in low resistance states, due to the resistance elements 1210-1~1210-n, the equivalent resistance of the same memory string is not too low and also the string current is not too high. Thus the voltage level of the loading capacitor C is raised not too rapidly. Therefore, an error determination may be prevented or eliminated.

In one embodiment of the application, the computing memory cells have at least two resistance states, i.e. high resistance state and low resistance state. When the computing memory cell is in the high resistance state (i.e. a first resistance state), the computing memory cell has a high resistance value RH (i.e. a first resistance value); and when the computing memory cell is in the low resistance state (i.e. a second resistance state), the computing memory cell has a low resistance value RL (i.e. a second resistance value).

In one embodiment of the application, the equivalent resistance RS of the resistance elements 1210-1~1210-n are for example but not limited by, RS=2RL or RS=5RL, which may effectively prevent the fast charging behavior. Further, in one embodiment of the application, the equivalent resistance RS of the resistance elements 1210-1~1210-n are for example but not limited by, RS=10RL or RS≥0.5*RH, which may effectively or totally eliminate the fast charging behavior.

In one embodiment of the application, for example but not limited by, the high resistance RH and the low resistance RL of the computing memory cells are 555K ohm and 13K ohm, respectively. The equivalent resistance RS of the resistance elements 1210-1~1210-n are set as the above explanation to prevent or eliminate the fast charging behavior.

As shown in FIG. 13B, in one embodiment of the application, when there are no any resistance element (without RS), the fast charging behavior is obvious. When the equivalent resistance RS of the resistance elements 1210-1~1210-n is gradually higher, the fast charging behavior is gradually prevented or eliminated. Thus, in the embodiment of the application shown in FIG. 12, the fast charging behavior is gradually prevented or eliminated and thus the error determination possibility is reduced.

In one embodiment of the application, each of the resistance elements 1210-1~1210-n is a resistor made by process. Alternatively, in one embodiment of the application, each of the resistance elements 1210-1~1210-n is a transistor. Alternatively, in one embodiment of the application, each of the resistance elements 1210-1~1210-n is a combination of a transistor and a resistor, wherein for the programming operations or the computing memory cell weight adjustment process, the transistor is bypass; and for the sensing operations, the transistor is turned off.

In one embodiment of the application, the power consumption of the IMC operations in the IMC memory device can be adjusted to a reasonable sensing range by tuning the loading capacity value of the loading capacitor. For a certain number of the computing memory cells and a certain number of the input values, by carefully arranging the number of the memory strings and the number of the computing memory in a single memory string, the power consumption is reduced.

In one embodiment of the application, the computing memory cell number on one memory string can be any larger than 2 (including 2); and the memory array may include any number of the memory strings. Further, the resistance of the computing memory cells may be changed by the input value.

The read voltage is lower than 1V which is compatible to the operation scheme of NAND flash memory device.

In one embodiment of the application, the memory device 100 may be used in for example but not limited by, neural network calculation, the sum-of-product calculation, comparison of input data with stored data in the memory array and the like.

In one embodiment of the application, the IMC operation is not performed under the sum-of-voltage architecture, and thus more input values are concurrently calculated. Also, a single amplifier meets the requirements of IMC operations. Therefore, one embodiment of the application has advantages of lowering reading errors and power consumption.

The IMC memory device of one embodiment of the application is the mixed mode of the sum-of-current architecture and the sum-of-voltage architecture and thus more input values are concurrently calculated. Further, the large summed current problem raised by the sum-of-current architecture is prevented and also the low sensing current problem raised by the sum-of-voltage architecture is also prevented.

It will be apparent to those skilled in the art that various modifications and variations may be made to the disclosed embodiments. It is intended that the specification and examples be considered as exemplary only, with a true scope of the disclosure being indicated by the following claims and their equivalents.

What is claimed is:

1. An in-memory computing (IMC) memory device, comprising:
    a plurality of computing memory cells, the plurality of computing memory cells forming a plurality of memory strings, the plurality of computing memory cells storing a plurality of weight values;
    a loading capacitor coupled to the plurality of computing memory cells; and
    a measurement circuit coupled to the loading capacitor, wherein in a plurality of IMC operations performed by the IMC memory device,
    a plurality of input voltages are input into the plurality of computing memory cells, the plurality of input voltages being corresponding to a plurality of input values,
    a plurality of effective resistances of the computing memory cells are corresponding to the input voltages and the weight values,
    when a read voltage is applied to the plurality of computing memory cells, the plurality of computing memory cells are configured to generate a plurality of cell currents, the plurality of cell currents are summed into a plurality of memory string currents,
    the plurality of memory strings are configured to charge the loading capacitor with the plurality of memory string currents,
    the measurement circuit is configured to measure a capacitor voltage of the loading capacitor, and
    based a relationship between the capacitor voltage of the loading capacitor, at least one delay time and a predetermined voltage, an operation result of the plurality of input values and the plurality of weight values is determined.

2. The IMC memory device according to claim 1, wherein each of the plurality of memory strings are coupled in parallel, and each of the plurality of memory strings includes at least two cascaded memory cells, and
    the delay time is defined as from a first timing when the read voltage is applied until a second timing when the capacitor voltage of the loading capacitor is charged to the predetermined voltage, the predetermined voltage is determined based on the read voltage.

3. The IMC memory device according to claim 1, wherein at a plurality of predetermined delay times, whether the capacitor voltage reaches the predetermined voltage is checked to generate a comparison result, the comparison result indicating the operation result of the input values and the weight values.

4. The IMC memory device according to claim 1, wherein each of the plurality of computing memory cells includes:
    a transistor, coupled to a bit line, wherein the transistor receives the read voltage through the bit line and receives the input voltage for generating the cell current,
    a threshold voltage of the transistor is adjusted as a first threshold voltage value or a second threshold voltage value in response to the weight value; and
    in response to the input voltage and the threshold voltage of the transistor, the transistor is in a turned-on state or a turned-off state.

5. The IMC memory device according to claim 4, wherein:
    when the input voltage has a first input voltage value and the threshold voltage has the second threshold voltage value, the transistor is in the turned-off state, the computing memory cell generates no cell current; and
    when the input voltage has a second input voltage value, the transistor is in the turned-on state, the computing memory cell generates the cell current;
    the first input voltage value is lower than the second input voltage value, the first threshold voltage value is lower than the second threshold voltage value, the first input voltage value is lower than the second threshold voltage value, and the first voltage difference is lower than the second voltage difference.

6. The IMC memory device according to claim 5, wherein each of the plurality of computing memory cells further comprises:
    a resistor, coupled to the transistor in parallel and coupled to the bit line, the resistor has a fixed resistance value or a variable resistance value,
    the variable resistance value of the resistor is adjusted as at least a first resistance value or a second resistance value in response to the weight value.

7. The IMC memory device according to claim 1, wherein each of the plurality of computing memory cells includes:
    a multiplexer; and
    a plurality of resistors coupled to the multiplexer, wherein
    the multiplexer receives the read voltage and the input voltage,
    based on the input value, the multiplexer applies the read voltage to one of the plurality of resistors,
    the cell current generated by the computing memory cell is corresponding to the read voltage and one of the plurality of resistors, and
    based on the weight value of the computing memory cell, resistance values of the plurality of resistors are adjusted.

8. The IMC memory device according to claim 1, wherein each of the plurality of computing memory cells includes:
    a plurality of switches receiving the input voltage; and
    a plurality of resistors coupled to the plurality of switches, wherein
    the input voltage controls turning on or off of the plurality of switches and thus the rad voltage is selectively applied to one of the plurality of resistors via the plurality of switches, and
    based on the weight value of the computing memory cell, resistance values of the plurality of resistors are adjusted.

9. The IMC memory device according to claim 1, further including:
  a plurality of resistance elements included in the plurality of memory strings, the plurality of resistance elements being serially coupled to the plurality of computing memory cells.

10. The IMC memory device according to claim 9, wherein
  the plurality of computing memory cells have a first resistance value and a second resistance value lower than the first resistance value; and
  an equivalent resistance of the plurality of computing memory cells is equivalent to or higher than double of the second resistance value, or the equivalent resistance of the plurality of computing memory cells is equivalent to or higher than a half of the first resistance value.

11. An in-memory computing (IMC) method applicable to an IMC memory device, the IMC method comprising:
  storing a plurality of weight values in a plurality of computing memory cells, the plurality of computing memory cells forming a plurality of memory strings;
  inputting a plurality of input voltages into the plurality of computing memory cells, the plurality of computing memory cells having a plurality of effective resistances corresponding to the input voltages and the weight values, the plurality of input voltages being corresponding to a plurality of input values;
  generating, when a read voltage is applied to the plurality of computing memory cells, a plurality of cell currents from the plurality of computing memory cells, the plurality of cell currents are summed into a plurality of memory string currents;
  charging the loading capacitor with the plurality of memory string currents from the plurality of memory strings;
  measuring a capacitor voltage of the loading capacitor; and
  determining an operation result of the plurality of input values and the plurality of weight values based a relationship between the capacitor voltage of the loading capacitor, at least one delay time and a predetermined voltage.

12. The IMC method according to claim 11, wherein the delay time is defined as from a first timing when the read voltage is applied until a second timing when the capacitor voltage of the loading capacitor is charged to the predetermined voltage, the predetermined voltage determined based on the read voltage.

13. The IMC method according to claim 11, wherein at a plurality of predetermined delay times, whether the capacitor voltage reaches the predetermined voltage is checked to generate a comparison result, the comparison result indicating the operation result of the input values and the weight values.

14. The IMC method according to claim 11, wherein each of the plurality of computing memory cells includes:
  a transistor, coupled to a bit line,
  wherein
  the transistor receives the read voltage through the bit line and receives the input voltage, and the computing memory cell generates the cell current;
  a threshold voltage of the transistor is adjusted as a first threshold voltage value or a second threshold voltage value in response to the weight value; and
  in response to the input voltage and the threshold voltage of the transistor, the transistor is in a turned-on state or a turned-off state.

15. The IMC method according to claim 14, wherein:
  when the input voltage has a first input voltage value and the threshold voltage has the second threshold voltage value, the transistor is in the turned-off state, the computing memory cell generates no cell current; and
  when the input voltage has a second input voltage value, the transistor is in the turned-on state, the computing memory cell generates the cell current;
  the first input voltage value is lower than the second input voltage value, the first threshold voltage value is lower than the second threshold voltage value, the first input voltage value is lower than the second threshold voltage value, and the first voltage difference is lower than the second voltage difference.

16. The IMC method according to claim 15, wherein each of the plurality of computing memory cells further comprises:
  a resistor, coupled to the transistor in parallel and coupled to the bit line,
  wherein
  the resistor has a fixed resistance value or a variable resistance value,
  the variable resistance value of the resistor is adjusted as at least a first resistance value or a second resistance value in response to the weight value.

17. The IMC method according to claim 11, wherein each of the plurality of computing memory cells includes:
  a multiplexer; and
  a plurality of resistors coupled to the multiplexer,
  wherein
  the multiplexer receives the read voltage and the input voltage,
  based on the input value, the multiplexer applies the read voltage to one of the plurality of resistors,
  the cell current generated by the computing memory cell is corresponding to the read voltage and one of the plurality of resistors, and
  based on the weight value of the computing memory cell, resistance values of the plurality of resistors are adjusted.

18. The IMC method according to claim 11, wherein each of the plurality of computing memory cells includes:
  a plurality of switches receiving the input voltage; and
  a plurality of resistors coupled to the plurality of switches,
  wherein
  the input voltage controls turning on or off of the plurality of switches and thus the rad voltage is selectively applied to one of the plurality of resistors via the plurality of switches, and
  based on the weight value of the computing memory cell, resistance values of the plurality of resistors are adjusted.

19. The IMC method according to claim 11, wherein:
  the IMC memory device further includes a plurality of resistance elements included in the plurality of memory strings, the plurality of resistance elements being serially coupled to the plurality of computing memory cells;
  the plurality of computing memory cells have a first resistance value and a second resistance value lower than the first resistance value; and
  an equivalent resistance of the plurality of computing memory cells is equivalent to or higher than double of the second resistance value, or the equivalent resistance of the plurality of computing memory cells is equivalent to or higher than a half of the first resistance value.

* * * * *